(12) United States Patent
Maeda et al.

(10) Patent No.: US 7,821,334 B2
(45) Date of Patent: Oct. 26, 2010

(54) AMPLIFICATION CIRCUIT

(75) Inventors: Tadashi Maeda, Tokyo (JP); Tomoyuki Yamase, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 169 days.

(21) Appl. No.: 12/298,185

(22) PCT Filed: Apr. 24, 2007

(86) PCT No.: PCT/JP2007/058807

§ 371 (c)(1),
(2), (4) Date: Nov. 20, 2008

(87) PCT Pub. No.: WO2007/125895

PCT Pub. Date: Nov. 8, 2007

(65) Prior Publication Data

US 2010/0060354 A1    Mar. 11, 2010

(30) Foreign Application Priority Data

Apr. 27, 2006  (JP) .............................. 2006-123611
Sep. 19, 2006  (JP) .............................. 2006-252386
Dec. 26, 2006  (JP) .............................. 2006-348974

(51) Int. Cl.
   *H03F 1/14* (2006.01)
(52) U.S. Cl. ..................... 330/51; 330/124 R
(58) Field of Classification Search ................... 330/51, 330/124 R, 295, 302
   See application file for complete search history.

(56) References Cited

U.S. PATENT DOCUMENTS 6,128,479 A * 10/2000 Fitzpatrick et al. .......... 455/137

(Continued)

FOREIGN PATENT DOCUMENTS

JP          04-167601          6/1992

(Continued)

OTHER PUBLICATIONS

Zhiwei Xu et al., A Compact Dual-Band Direct-Conversion CMOS Transceiver for 802.11 a/b/g WLAN, ISSCC 2005 / Session 5 / WLAN Transceiver / 5.4, 2005, pp. 1-3.

(Continued)

*Primary Examiner*—Henry K Choe
(74) *Attorney, Agent, or Firm*—Young & Thompson

(57) ABSTRACT

The present invention is aimed at realizing an amplifying circuit whose chip size is prevented from being significantly increased even if the number of compatible frequencies increases, and which has a wide dynamic range when it operates under a low voltage. The amplifying circuit includes a plurality of impedance converting circuits connected to each other by a switching circuit of a first type having a signal cutting-off function, a switching circuit of a second type connected to a path branched from an input side of the switching circuit of the first type, the switching circuit of the second type having a signal cutting-off function, amplifiers connected respectively to an output side of one of the impedance converting circuits in a final stage and to an output side of the switching circuit of the second type, and a control signal generating circuit for controlling connection/disconnection between said switching circuit of the first type and said switching circuit of the second type; wherein either one of the paths is selected to input a signal to one of the amplifiers.

22 Claims, 15 Drawing Sheets

U.S. PATENT DOCUMENTS

| | | |
|---|---|---|
| 7,030,691 B2 * | 4/2006 | Kim .......................... 330/51 |
| 7,385,445 B2 * | 6/2008 | Wright ....................... 330/51 |
| 7,589,588 B2 * | 9/2009 | Ohnishi et al. ............... 330/51 |

FOREIGN PATENT DOCUMENTS

| | | |
|---|---|---|
| JP | 05-48440 | 6/1993 |
| JP | 07-079132 | 3/1995 |
| JP | 2001-244755 | 9/2001 |
| JP | 2002-051538 | 2/2002 |
| JP | 2002-368562 | 12/2002 |
| JP | 2003-037478 | 2/2003 |
| JP | 2003-142964 | 5/2003 |
| JP | 2003-168996 | 6/2003 |
| JP | 2003-243954 | 8/2003 |
| JP | 2005-159803 | 6/2005 |
| JP | 2006-087070 | 3/2006 |
| WO | 2005/048448 | 5/2005 |

OTHER PUBLICATIONS

John F. Dickson, On-Chip High-Voltage Generation in MNOS Integrated Circuits Using an Improved Voltage Multiplier Technique, IEEe Journal of Solid-State Circuits, vol. SC-11, No. 3, Jun. 1976, pp. 1-5.

* cited by examiner

AMPLIFICATION CIRCUIT

TECHNICAL FIELD

The present invention relates to an amplifier which has a wide dynamic range when it operates under a low voltage and which operates in a wide frequency range.

BACKGROUND ART

The Global system for Mobile Communications (GSM) and the Digital Cellular system (DCS) for use in the second-generation cellular phones according to the present global mainstream cellular phone system have already employed four radio frequency bands of 800, 900, 1800, 1900 MHz in order to provide a wide user area. In the future, as second-generation cellular phones shift to third-generation cellular phones based on Enhanced Data GSM Environment (EDGE), CDMA (Code Division Multiple Access), and Wideband CDMA (WCDMA) systems, dual terminals that are individually capable of using second- and third-generation services will be put into service, which will require that cellular phones be compatible with 1.7 GHz and 2 GHz bands in addition to the above four bands.

The study of high-speed systems as next-generation mobile communication systems for achieving transmission rates ranging from several tens to 100 Mbps has also been started. In addition to these public mobile communication systems, efforts to incorporate a plurality of wireless systems such as wireless LAN according to IEEE802.11, Bluetooth, GPS, and terrestrial digital TV into cellular terminals have been accelerated. These applications will be added as standard features to cellular phones in the new future. The radio frequencies of these wireless systems span a wide range from 400 MHz to 5.8 GHz, and the front end of RF chips needs to have a circuit compatible with those frequency bands.

The frequency bands can be covered by a single circuit if its gain in desired frequency bands is sacrificed. Generally, however, a plurality of bands are available and selectively used to cover a wide frequency range (see, for example, Non-patent document 1).

Non-patent document 1 discloses a multiband-compatible chip having a plurality of parallel-connected amplifiers having matching circuits for respective frequencies to cover a plurality of frequency bands. Each of the circuits corresponding to a desired frequency band is activated one at a time, with the other circuits being kept in a shut-off state.

Another example which handles a plurality of frequency bands is a system proposed for suppressing input signals that will not be used by means of filters (see, for example, Patent document 1).

The example disclosed in Patent document 1 relates to a television receiver and comprises a wideband receiving circuit for receiving all terrestrial broadcasts and CATV channels.

FIG. 1 is a circuit diagram of a band switching circuit proposed in Patent document 1. Filter FL1 for passing a signal in a first frequency band and filter FL2 for passing a signal in a second frequency band are connected in series to each other. Filter FL1 is a high-pass filter comprising capacitors C21, C22, C23 and inductors L21, L22 for passing a signal in a low frequency range (e.g., 90 MHz and higher).

Filter FL2 is a high-pass filter comprising capacitors C24, C25, C26 and inductor L23 for passing a signal in a high frequency range (e.g., 470 MHz and higher). Switch device (PIN diode) SW1 is connected parallel to second filter FL2. When filter FL2 is required, switch 3 is turned off. When filter FL2 is not required, switch 3 is turned on.

Filter FL2 includes switch device (PIN diode) SW2 for turning on and off a series-connected resonant circuit of capacitor C25 and inductor L23. When second filter FL2 is not required, switch SW2 is turned off to disconnect the series-connected resonant circuit.

When the band switching circuit is to receive a signal in a frequency band ranging from 90 to 470 MHz which is input from input terminal IN, switch device SW1 is turned on and switch device SW2 is turned off to put only filter FL1 in operation while keeping filter FL2 out of operation, thereby outputting the signal from output terminal OUT while bypassing filter FL2. Therefore, only a signal of 90 MHz or higher from filter FL1 is output from output terminal OUT to an external circuit.

When the band switching circuit is to receive a signal in a frequency band ranging from 470 MHz to 770 MHz, switch device SW1 is turned off and switch device SW2 is turned on to put filter FL1 and filter FL2 simultaneously in operation. Therefore, a signal of 90 MHz or higher that has passed through filter FL1 is processed by filter FL2 into a signal of 470 MHz or higher, which is output from output terminal OUT to the external circuit.

Communication schemes using advanced modulation processes such as Quadrature Amplitude Modulation (QAM) and orthogonal frequency modulation (OFDM) have been studied for use in high-speed systems in recent years.

Since these communication schemes need a vast amount of digital processing for signal demodulation, attempts have been made to employ ultrasmall gate CMOS devices for use in digital baseband circuits having low power consumption requirements. As the devices become smaller and smaller in size, the power supply voltage therefor tends to be lower—from 3.3 V for 0.35 μm, 2.5 V for 0.25 μm, 1.8 V for 0.18 μm, 1.2 V for 0.13 μm, 1.0 V for 90 nm.

To reduce the cost of chips, the tendency to produce an RF circuit and a digital circuit as one chip is being accelerated. Accordingly, RF circuits that are operable under low voltages are needed. One of the greatest concerns in achieving lower RF circuit voltages is a dynamic range. The dynamic range may be considered to be from the maximum signal level that can be handled, to less a lower noise level.

Generally, a circuit scheme for varying the gain of an amplifying circuit depending on the intensity of an input signal is employed to keep a wide dynamic range (see, for example, Patent document 2).

FIG. 2 is a circuit diagram of a variable-gain amplifying circuit disclosed in Patent document 2. Gain control amplifying circuit 201 comprises amplifying transistor unit 202 and variable attenuators 203a, 203b disposed in a front stage thereof.

Amplifying transistor unit 202 includes amplifying MOSFETs Q30, Q31 and amplifying MOSFETs Q32, Q33 that are connected parallel thereto. Differential input signals F2a, F2b that are input to input terminals INa, INb are supplied through respective variable attenuators 203a, 203b to the gates of amplifying MOSFETs Q30, Q32.

First bias voltage Vbias1 is supplied through resistor R11 to the gates of amplifying MOSFETs Q31, Q33, and second bias voltage Vbias2 is supplied through resistor R12 to the gates of amplifying MOSFETs Q30, Q32.

MOSFETs Q31, A33 have respective drains connected to power supply terminal Vdd through load inductors L31, L32. The drains of MOSFETs Q31, A33 output differential output signals Fouta, Foutb from output terminals OUTa, OUTb through output coupling capacitors Couta, Coutb.

The overall gain of gain control amplifying circuit 201 is controlled by varying the attenuations of variable attenuators 203a, 203b which are connected between the gates of amplifying MOSFETs Q30, Q32 of amplifying transistor unit 202 and input terminals INa, INb.

Each of variable attenuators 203a, 203b includes input coupling capacitor Cin whose capacitance is variable and which is connected between input terminal INa (INb) and signal propagation path SPR leading to the gate of MOSFET Q32 (Q30).

Input coupling capacitor Cin comprises a plurality of capacitors C51 through C54 and n-channel switching MOSFETs Q51 through Q54. The capacitance of input coupling capacitor Cin is varied when these MOSFETs are rendered conductive and nonconductive by coupling capacitance control signals GC11 through CG14.

Signal propagation path SPR is connected to power supply ground by a plurality of (four in FIG. 2) parallel attenuating units comprising respective attenuating capacitors C41 through C44 and switching MOSFETs Q41 through Q44 connected in series thereto.

Switching MOSFETs Q41 through Q44 have respective gates supplied with respective attenuation control signals GC1 through CG4 for rendering switching MOSFETs Q41 through Q44 conductive and nonconductive.

High-frequency input signal F2a (F2b) applied to input terminal INa (INb) is supplied through input coupling capacitor Cin and signal propagation path SPR to the gate of amplifying MOSFET Q32 (Q30).

If attenuation control signal GC1 reaches a high level to render MOSFET Q41 conductive, then part of the energy of the high-frequency signal that is propagated through signal propagation path SPR is absorbed through attenuating capacitor C41 and MOSFET Q41 into ground.

Specifically, attenuating capacitor C41 has a function to short an AC component of the high-frequency signal to ground GND. The amount of energy that is absorbed is determined depending on the capacitance value of attenuating capacitor C41.

By increasing the number of attenuating capacitors by rendering other transistors conductive, the amount of absorbed energy is increased, resulting in an increase in the attenuation.

If the variable attenuators are designed to increase the capacitance values of attenuating capacitors C41 through C44 in a binary fashion of 1:2:4:8, for example, and also if the widths of the gates of switching MOSFETs Q41 through Q44 are of the same ratio, then the attenuation of variable attenuator 203a (203b) can be increased linearly by using attenuation control signals GC1 through CG4 in appropriate combinations.

Specifically, the attenuation is of the lowest level when all MOSFETs Q41 through Q44 are rendered nonconductive, and is linearly increased when MOSFETs Q41 through Q44 are rendered nonconductive in combinations.

Therefore, the amplitude of the input high-frequency input signal is linearly varied by attenuator 203a (203b), and then amplified at a fixed gain by amplifying transistor unit 202.

As a result, the gain of the overall amplifying circuit is linearly varied. Since the gain is increased by two cascaded MOSFETs Q30, Q31 of amplifying transistor unit 202, the variable range of the gain can be widened.

FIG. 3 shows a charge pump circuit as disclosed in Patent document 3 for boosting the control signals for signal switching circuits Q51 through Q54 shown in FIG. 2. The charge pump circuit stores electric charges in capacitive elements using a clock for thereby obtaining a potential higher than an input potential. The charge pump circuit comprises a plurality of boosting stages for higher boosting efficiency.

As shown in FIG. 3, the boosting circuit comprises n boosting stages $CP_1, CP_2, \ldots CP_n$. Each boosting stage $CP_k$ (k is 1, 2, ..., n) comprises first charge pump 11 and second charge pump 13.

First charge pump 11 of boosting stage $CP_k$ comprises n-type MOSFET $nQ1_k$, p-type MOSFET $pQ1_k$, and pumping capacitor $C1_k$. Second charge pump 13 of boosting stage $CP_k$ comprises n-type MOSFET $nQ2_k$, p-type MOSFET $pQ2_k$, and pumping capacitor $C2_k$.

When clock CLK is of a power supply voltage (CLKbar is 0 V), n-type MOSFET $nQ2_k$ and p-type MOSFET $pQ1_k$ are rendered conductive, charging capacitor $C2_k$ to the potential of node $ND_{k-1}$. The potential of the drain of p-type MOSFET $pQ1_k$ (the potential boosted by the clock provided by the charged potential of capacitor $C1_k$) is transferred to node $ND_k$.

When the clock is inverted to raise CLKbar to the power supply voltage (CLK is 0 V), n-type MOSFET $nQ1_k$ and p-type MOSFET $pQ2_k$ are rendered conductive, charging capacitor $C1_k$ to the potential of node $ND_{k-1}$. The potential of the drain of p-type MOSFET $pQ2_k$ (the potential boosted by the clock provided by the charged potential of capacitor $C2_k$) is transferred to node $ND_k$.

Non-patent document 1: 2005 IEEE International Solid State Circuit Conference, SESSION 5, pp. 98-99 & 586

Patent document 1: JP-U No. 5-48440

Patent document 2: JP-A No. 2005-159803

Patent document 3: JP-A No. 2000-69745

DISCLOSURE OF THE INVENTION

Problems to be Solved by the Invention

The circuit scheme which has parallel circuits corresponding to respective frequencies for covering a plurality of frequency bands, as disclosed in Non-patent document 1, suffers a large cost problem because the chip size increases greatly as the number of compatible frequencies increases.

According to the scheme which uses a single receiving circuit with its band widened to a desired frequency range, there is a trade-off between power consumption and gain. Within a range of power consumption suitable for wireless circuits, since the scheme fails to achieve a gain for a sufficient carrier-to-noise ratio (C/N), it is incompatible with the advanced modulation system, and, as a result, is not applicable to high-data-rate systems.

Chips that are compatible with the advanced modulation system have been part of trends to reduce device sizes to meet requirements for higher baseband signal processing rates, and smaller device sizes have resulted in lower power supply voltages for processing baseband signals.

In the future, the tendency to produce system-on-chip (SoC) devices where an RF circuit and a digital circuit are integrally combined with each other will be accelerated to achieve cost reduction. Since RF circuits need to be constructed of small devices, it is important that the RF circuits have a wide dynamic range when they operate under a low voltage.

Generally, since the dynamic range of an RF circuit tends to be lower because the power supply voltage therefor is lower, it is a major challenge for the RF circuit to be able to attain a desired dynamic range when the RF circuit operates under a lower voltage.

According to the background art shown in FIG. 1, if a filter circuit for suppressing a frequency other than a desired frequency is replaced with a matching circuit, then matching is possible at a plurality of frequencies. However, achieving a dynamic range requires an amplifying stage whose amplification factor can be varied greatly. Such an amplifying stage comprises cascaded transistors as shown in FIG. 2, for example, with the result that the power supply voltage of the amplifying state cannot be lowered.

It is possible to obtain a dynamic range by varying the amplitude of an input signal in the front stage of an amplifying stage. According to the background art shown in FIG. 2 wherein the amplitude of an input signal is varied by the divided capacitance, however, since leakage is caused by the parasitic capacitances of the switching circuits that select the respective capacitors, a signal loss cannot be avoided when a weak signal requiring a maximum gain is input.

Scaled MOS devices suffer a serious problem caused by standby power due to leakage current that flows even when the gate voltage is biased to a level equal to or lower than the threshold voltage. To avoid this problem, there has been employed a scheme wherein the threshold voltage of a MOS device is not lowered in proportion to the power supply voltage.

According to such a scheme, even when the control voltages for switches Q51 through Q54 of the circuit shown in FIG. 2 are increased up to the power supply voltage, the on-resistances of the respective switches are not sufficiently reduced. Therefore, signal power loss tends to occur even if the switching circuits are kept conductive. If the control voltages are increased to deal with the problem using the circuit shown in Patent document 3, then voltages higher than the withstand voltages of the switches will be applied to the MOS devices.

The present invention is aimed at solving the above problems of the background art. It is an object of the present invention to provide an amplifying circuit which has a wide dynamic range when it operates under a low voltage and which operates in a wide frequency range.

Means for Solving the Problems

To achieve the above object, there is provided in accordance with the present invention an amplifying circuit comprising a plurality of impedance converting circuits connected to each other by a switching circuit of a first type having a signal cutting-off function, a switching circuit of a second type connected to a path branched from an input side of the switching circuit of the first type, the switching circuit of the second type having a signal cutting-off function, amplifiers connected respectively to an output side of one of the impedance converting circuits in a final stage and an output side of the switching circuit of the second type, and a control signal generating circuit for controlling connection/disconnection between said switching circuit of the first type and said switching circuit of the second type, wherein either one of the paths is selected to input a signal to one of the amplifiers.

To achieve the above object, there is also provided in accordance with the present invention an amplifying circuit comprising a plurality of impedance converting circuits connected to each other along a path by a switching circuit of a first type having a signal cutting-off function, a switching circuit of a second type connected between an output side of the switching circuit of the first type and an input terminal which is different from an input terminal to which an input side of one of the impedance converting circuits in a first stage is connected, the switching circuit of the second type having a signal cutting-off function, an amplifier connected to an output side of one of the impedance converting circuits in a final stage, and a control signal generating circuit for controlling connection/cutting-off of the switching circuit of the first type and the switching circuit of the second type, wherein either one of the paths is selected to input a signal to one of the amplifiers.

Preferably, one or more switching circuits of the first type and the switching circuit of the second type has/have a signal attenuating function. Preferably, the switching circuit having the signal cutting-off function and the signal attenuating function comprises a plurality of parallel-connected devices each controllable by the control signal generating circuit.

The switching circuits which comprise MOS field-effect transistors have a substrate potential linked to a DC input voltage of the amplifier. A control potential is increased by a potential corresponding to the DC input voltage of the amplifier, using a clock signal applied from an external source.

ADVANTAGES OF THE INVENTION

According to the present invention, the impedance converting circuits are connected to each other by the switching circuit of the first type having the signal cutting-off function, and the switching circuit of the second type is connected to the signal path branched from the input side of the switching circuit of the first type, or the impedance converting circuits that are connected to each other by the switching circuit of the first type that have the signal cutting-off function are connected to the switching circuit of the second type that have the signal cutting-off function which is connected between the output and input sides of the switching circuit of the first type. With this arrangement, the amplifying circuit is operable in a wide frequency band.

Since the switching circuits connected in series to the amplifiers have the signal attenuating function, the amplifying circuit provide a wide dynamic range when it is operated under a low voltage.

Since the amplifying circuit according to the present invention does not have a plurality of switch devices for connecting attenuating capacitors to and disconnecting attenuating capacitors from signal paths, the amplifying circuit can avoid leakage due to such switch devices, and can maintain good signal quality even when it is supplied with a weak signal input thereto.

Furthermore, since the switching circuits which comprise MOS field-effect transistors have the substrate potential linked to the DC input voltage of the amplifier, and since the control potential is increased by the potential corresponding to the DC input voltage of the amplifier, by using the clock signal applied from the external source, the on-resistances of the MOS field-effect transistors as the switching circuit are minimized, and a voltage in excess of a withstand voltage is prevented from being applied thereto.

According to the present invention, therefore, there is provided an amplifying circuit which is applicable to a software wireless terminal that is expected to be realized in the future.

DESCRIPTION OF REFERENCE CHARACTERS

Figure 1:
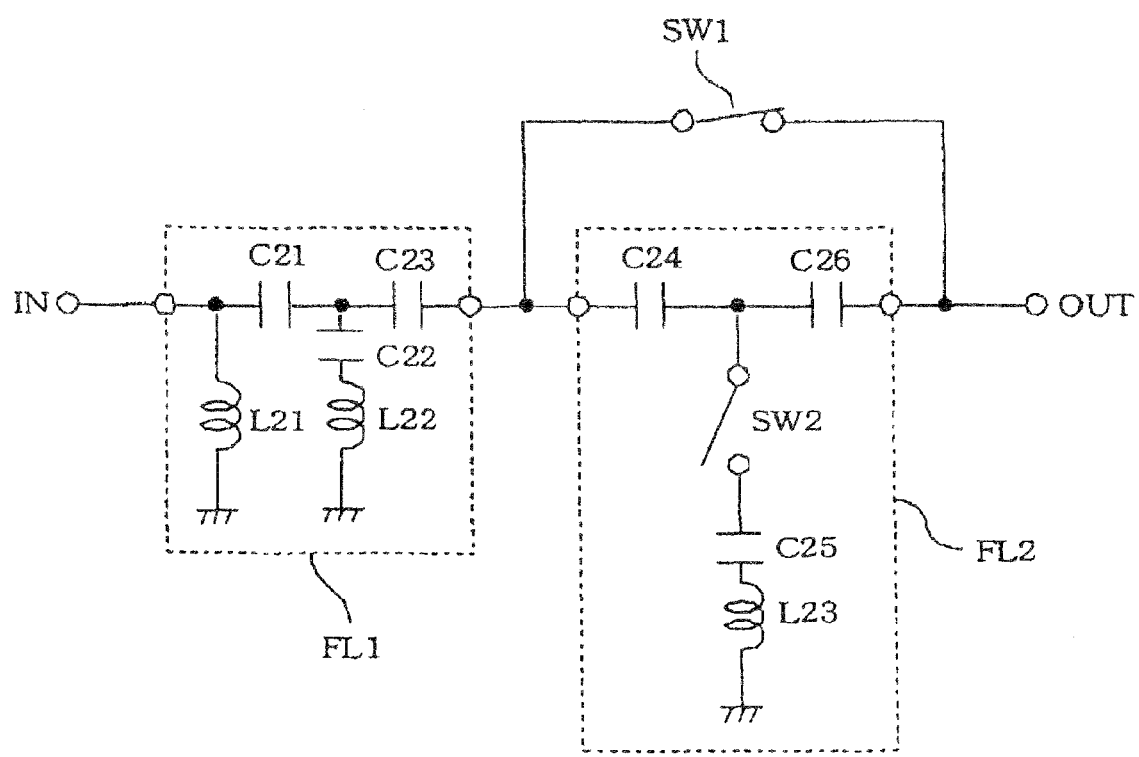
FIG. 1 is a circuit diagram of the background art disclosed in Patent document 1.
Figure 2:
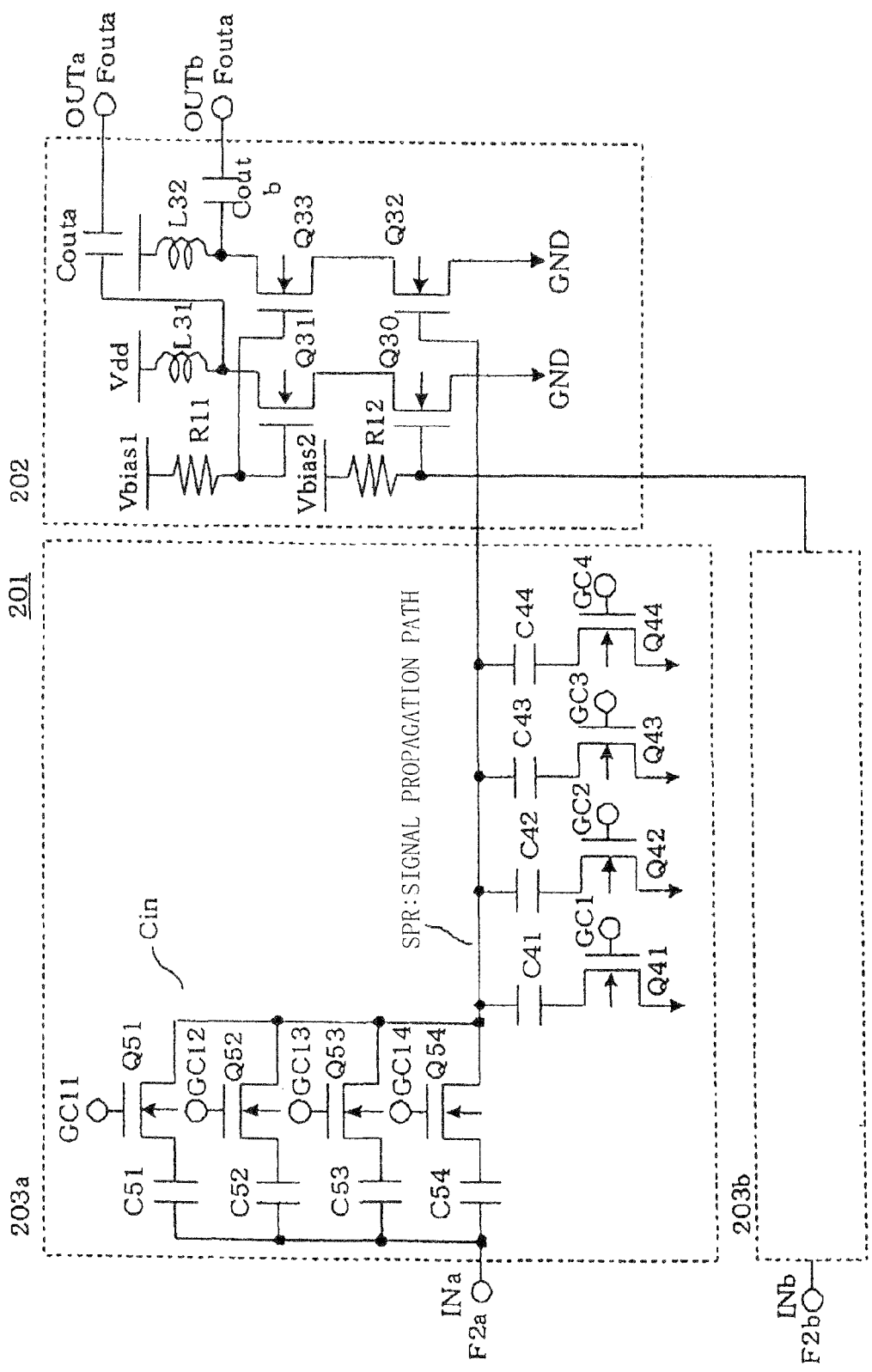
FIG. 2 is a circuit diagram of the background art disclosed in Patent document 2.
Figure 3:
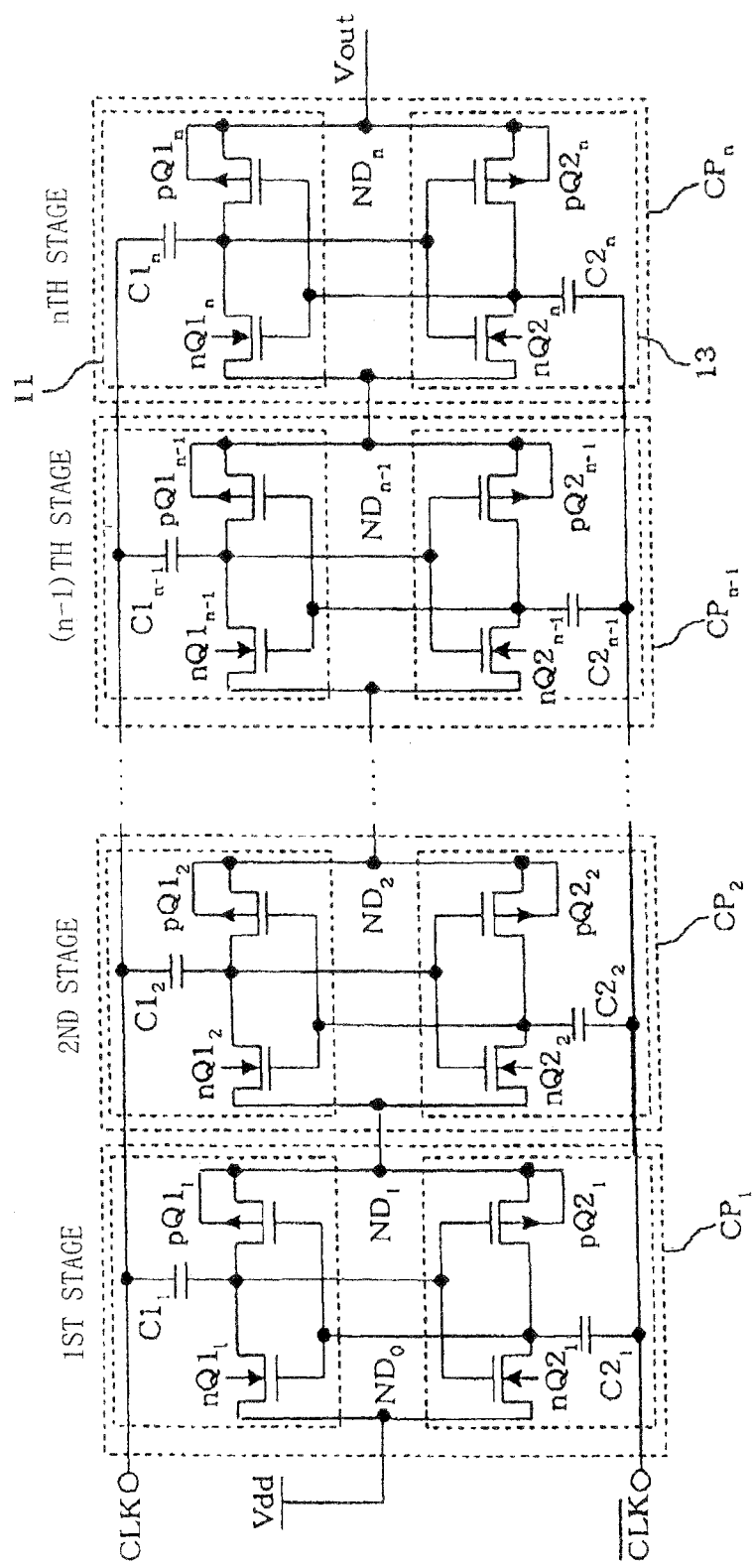
FIG. 3 is a circuit diagram of the background art disclosed in Patent document 3.

101, $101_1$, $101_2$, $101_3$ amplifier
102 control signal generating circuit
103, $103_1$, $103_2$ boosting circuit
201 gain control amplifying circuit
203 amplifying transistor unit
203a, 203b variable attenuator
FL1, FL2 filter
IN, $IN_1$, $IN_2$, INa, INb input terminal
Inc control signal input terminal
Inv voltage input terminal
OUT, OUT1, OUT2, OUT3, OUTa, OUTb, OUTv output terminal
MT1, MT2, MT3 matching circuit

BEST MODE FOR CARRYING OUT THE INVENTION

Specific embodiments of the present invention will be described in detail below. Identical parts will be denoted by identical reference characters, and repetitive descriptions will be omitted.

Exemplary Embodiment 1

Figure 4:
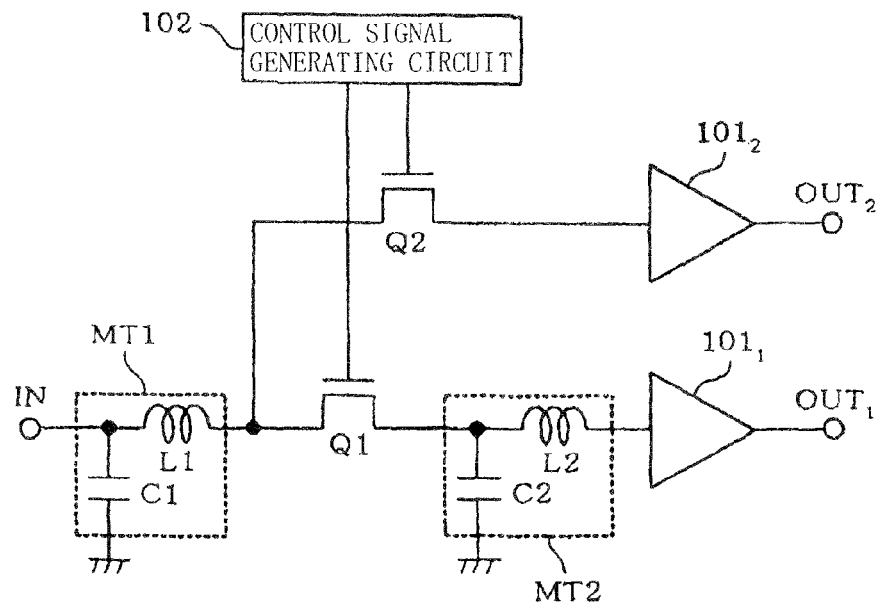
FIG. 4 is a circuit diagram of a first exemplary embodiment of the present invention.

FIG. 4 is a circuit diagram of a first exemplary embodiment of the present invention. IN represents an input terminal to which an RF signal is input, $OUT_1$, $OUT_2$ output terminals, MT1, MT2 matching circuits, C1, C2 capacitors, L1, L2 inductors, Q1, Q2 n-type MOSFETs, $101_1$ an amplifier which operates in a low frequency band, $101_2$ an amplifier which operates in a high frequency band, and 102 a control signal generating circuit for selecting signal paths.

If it is assumed that the input RF signal is in a high frequency band, then control signal generating circuit 102 cuts off MOSFET Q1 and renders MOSFET Q2 conductive. The input RF signal is now amplified by a circuit including matching circuit MT1 and amplifier $101_2$.

When the input signal power is increased, the control voltage for MOSFET Q2 is set to a level lower than if it is fully conductive, and the drain-to-source resistance of MOSFET Q2 is increased to attenuate the signal power. In this manner, amplifier $101_2$ is prevented from being saturated to achieve a wide dynamic range.

If the input RF signal is in a low frequency band, then control signal generating circuit 102 renders MOSFET Q1 conductive and cuts off MOSFET Q2. The input RF signal is now amplified by a circuit including matching circuits MT1, MT2 and amplifier $101_1$.

The amount by which matching circuit MT2 converts the impedance required for matching at a desired frequency is exclusive of the amount by which matching circuit MT1, connected to the front stage of matching circuit MT2, converts the impedance. As a result, the circuit size of matching circuit MT2 may be reduced.

When the input signal power is increased, the control voltage for MOSFET Q1 is set to a level lower than if it is fully conductive, and the drain-to-source resistance of the MOSFET is increased to attenuate the signal power. In this manner, amplifier $101_1$ is prevented from being saturated to achieve a wide dynamic range.

According to the present exemplary embodiment, the resistances of the selector switches inserted in the signal paths are controlled to adjust the intensity of the input signal. Therefore, the amplifying circuit is free of a signal leak path as with the circuit shown in FIG. 1, and maintains good characteristics even when a weak signal is input thereto.

Exemplary Embodiment 2

Figure 5:
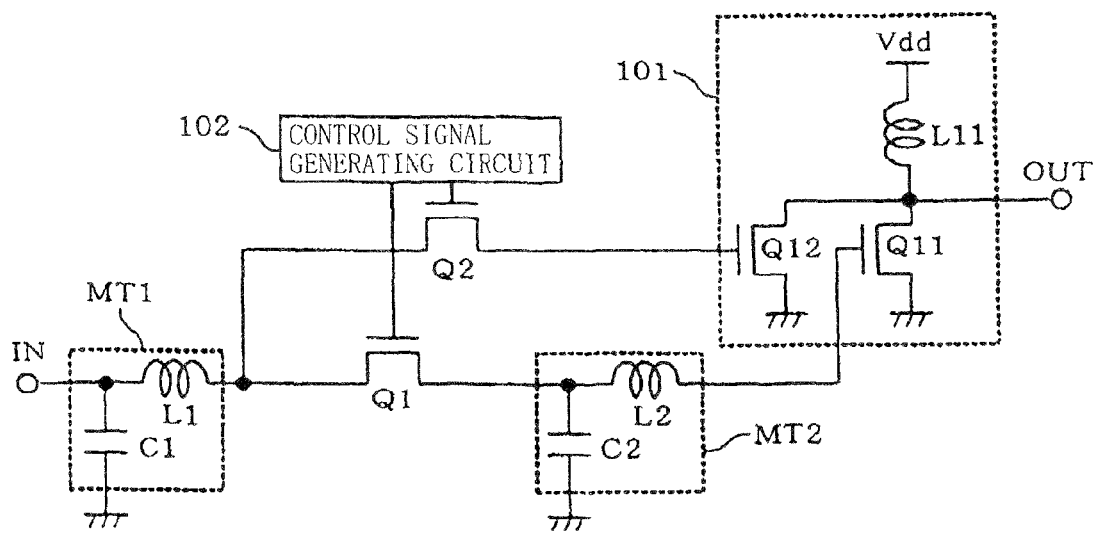
FIG. 5 is a circuit diagram of a second exemplary embodiment of the present invention.

FIG. 5 is a circuit diagram of a second exemplary embodiment of the present invention. In the present exemplary embodiment, amplifiers $101_1$, $101_2$ shown in FIG. 4 are replaced with single amplifier 101. Amplifier 101 includes inductor L11 and n-type MOSFETs Q11, Q12. MOSFET Q12 has a source electrode connected to ground, a gate electrode supplied with an RF signal in a high frequency band, and a drain electrode connected to output terminal OUT.

MOSFET Q11 has a source electrode grounded, a gate electrode supplied with an RF signal in a low frequency band, and a drain electrode connected to output terminal OUT. Inductor L11 is connected as a load on MOSFETs Q11, Q12 between power supply terminal Vdd and the drains of the respective transistors. The input RF signals are controlled by control signal generating circuit 102 such that only their desired frequency bands are propagated. Therefore, only one of the MOSFETs of amplifier 101 which is connected to the path in the desired frequency band is activated to amplify only the signal at the desired frequency.

Figure 6:
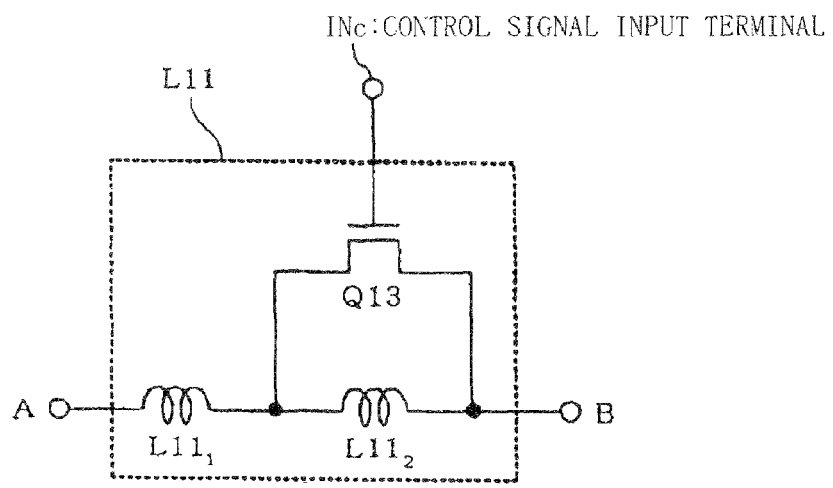
FIG. 6 is a circuit diagram showing an example of an output matching circuit of an amplifying circuit according to the present invention.

FIG. 6 is a circuit diagram showing an example of an output matching circuit of the amplifying circuit according to the present invention. The circuit shown in FIG. 6 has terminal A connected to power supply terminal Vdd shown in FIG. 5 and terminal B connected in common to the drain electrodes of MOSFETs Q11, Q12. The input section of the amplifier needs to be configured such that it is matched to a plurality of frequency bands and it will not saturate the amplifier even when the signal power changes greatly. However, the matching circuit in the output section is only required to select frequencies.

In FIG. 6, inductor L11 is divided into two inductors $L11_1$, $L11_2$, and switching MOSFET Q13 is connected parallel to inductor $L11_2$. $IN_c$ represents a control signal input terminal. If the input signal is in a high frequency band, then control signal input terminal $IN_c$ renders MOSFET Q13 conductive to short-circuit inductor $L11_2$, thereby reducing the overall inductance. The output matching circuit thus matches the input signal in the high frequency band. If the input signal is in a low frequency band, then MOSFET Q13 is cut off to increase the overall inductance, enabling the output matching circuit to match the input signal in the low frequency band.

Exemplary Embodiment 1

Figure 7:
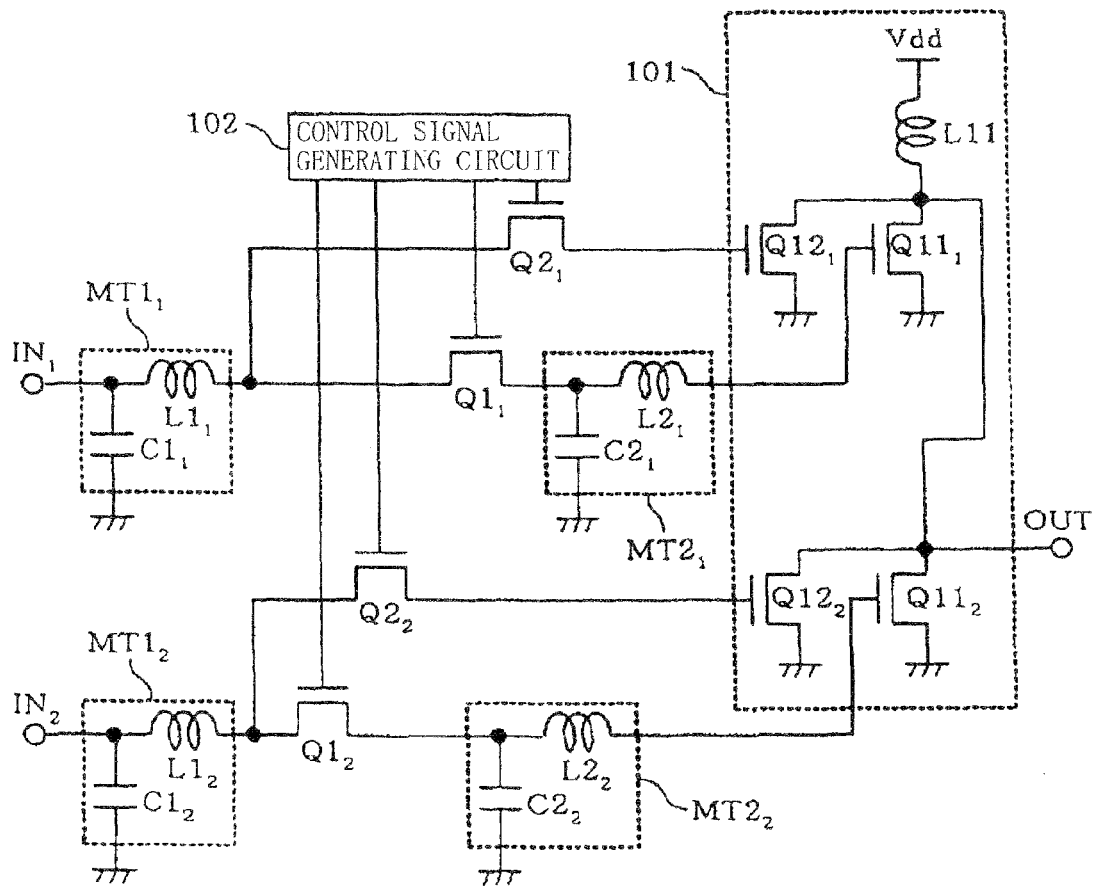
FIG. 7 is a circuit diagram of a third exemplary embodiment of the present invention.

FIG. 7 is a circuit diagram of a third exemplary embodiment of the present invention. The circuit according to the present exemplary embodiment comprises two circuits according to the second exemplary embodiment which are connected parallel to each other. In FIG. 7, $IN_1$, $IN_2$ represent input terminals to which an RF signal is input, $MT1_1$, $MT2_1$; $MT1_2$, $MT2_2$ matching circuits, $C1_1$, $C2_1$; $C1_2$, $C2_2$ capacitors, $L1_1$, $L2_1$; $L1_2$, $L2_2$ inductors, $Q1_1$, $Q2_1$; $Q1_2$, $Q2_2$ n-type MOSFETs, and $Q11_1$, $Q12_1$; $Q12_2$, $Q12_2$ n-type MOSFETs having inductor L11 as a common load. Control signal generating circuit 102 selectively renders either one of MOSFETs $Q1_1$, $Q2_1$; $Q1_2$, $Q2_2$ to select a signal path.

If a plurality of frequency bands to be handled are largely different from each other, it is difficult to separate a high frequency band and a low frequency band from each other with a single signal path. Depending on the communication scheme, it may be necessary to connect a filter for removing interfering waves to the front stages of input terminals $IN_1$, $IN_2$. In such a case, it is effective to employ the arrangement according to the present exemplary embodiment.

According to the present exemplary embodiment, for matching the output circuit, inductor L11 may have four selectable inductance values, and one of the four selectable inductance values may be selected depending on the frequency band of an input RF signal.

Exemplary Embodiment 4

Figure 8:
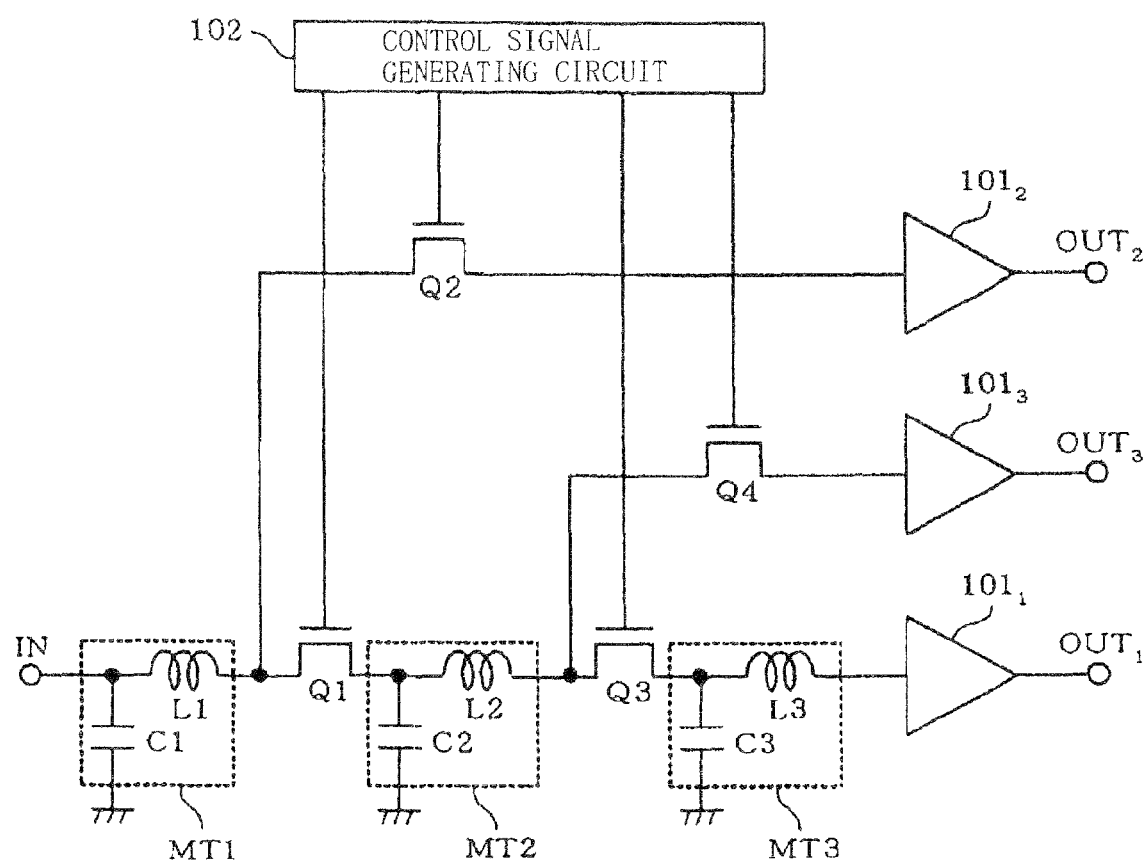
FIG. 8 is a circuit diagram of a fourth exemplary embodiment of the present invention.

FIG. 8 is a circuit diagram of a fourth exemplary embodiment of the present invention. The circuit according to the present exemplary embodiment is different from the amplifying circuit according to the first exemplary embodiment in that it includes another matching circuit added to the RF signal path for the low frequency band and additionally includes an RF signal path for an intermediate frequency band. In FIG. 8, IN represents an input terminal to which an RF signal is input, $OUT_1$ through $OUT_3$ are an output terminal, MT1 through MT2 are matching circuits, C1 through C3 are capacitors, L1 through L3 are inductors, Q1 through Q4 are switching n-type MOSFETs, $101_1$ is an amplifier which operates in a low frequency band, $101_2$ an amplifier which operates in a high frequency band, $101_3$ is an amplifier which operates in an intermediate frequency band, and 102 is a control signal generating circuit for outputting control signals to MOSFETs Q1 through Q4 for selecting signal paths.

If it is assumed that the input RF signal is in a high frequency band, then control signal generating circuit 102 cuts off MOSFETs Q1, Q3, Q4 and renders MOSFET Q2 conductive. The input RF signal is now amplified by a circuit including matching circuit MT1 and amplifier $101_2$. When the input signal power is increased, the control voltage for MOSFET Q2 is set to a level lower than if it is fully conductive, thereby attenuating the signal power.

If the input RF signal is in an intermediate frequency band, then control signal generating circuit 102 renders MOSFETs Q1, Q4 conductive and cuts off MOSFETs Q2, Q3. The input RF signal is now amplified by a circuit including matching circuits MT1, MT2 and amplifier $101_3$. When the input signal power is increased, the control voltage for MOSFETs Q1, Q4 is set to a level lower than if they are fully conductive, thereby attenuating the signal power.

Alternatively, the control voltage for either one of MOSFETs Q1, Q4, e.g., MOSFET Q1, is kept at a sufficiently high level and the control voltage for the other MOSFET Q4 is set to a level lower than if it is fully conductive, thereby attenuating the signal power. If the input RF signal is in a low frequency band, then control signal generating circuit 102 renders MOSFETs Q1, Q3 conductive and cuts off MOSFETs Q2, Q4. The input RF signal is now amplified by a circuit including matching circuits MT1 through MT3 and amplifier $101_1$.

When the input signal power is increased, the control voltage for MOSFETs Q1, Q3 is set to a level lower than if they are fully conductive, thereby attenuating the signal power. Alternatively, the control voltage for either one of MOSFETs Q1, Q3, e.g., MOSFET Q1, is kept at a sufficiently high level and the control voltage for the other MOSFET Q3 is set to a level lower than if it is fully conductive, thereby attenuating the signal power.

If a plurality of frequency bands to be handled are largely different from each other, and if it is difficult to separate a high frequency band and a low frequency band from each other with two signal paths, then it is effective to employ the amplifying circuit according to the present exemplary embodiment.

Exemplary Embodiment 5

Figure 9:
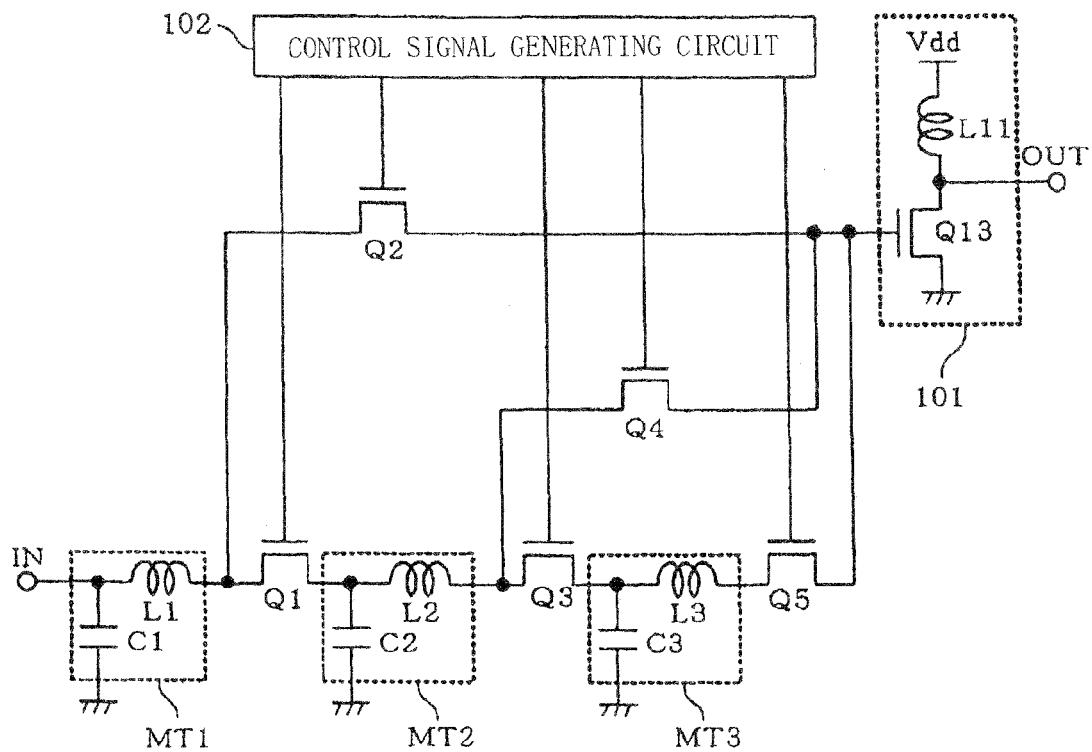
FIG. 9 is a circuit diagram of a fifth exemplary embodiment of the present invention.

FIG. 9 is a circuit diagram of a fifth exemplary embodiment of the present invention. In the present exemplary embodiment, amplifiers $101_1$, $101_2$, $101_3$ of the exemplary embodiment shown in FIG. 8 are replaced with single amplifier 101. Switching n-type MOSFET Q5 is connected between matching circuit MT3 and amplifier 101.

According to the present exemplary embodiment, amplifier 101 comprises only single n-type MOSFET Q13 and inductor L11. If the input RF signal is in a high frequency band, then control signal generating circuit 102 cuts off MOSFETs Q1, Q3 through Q5 and renders MOSFET Q2 conductive. If the input RF signal is in an intermediate frequency band, then control signal generating circuit 102 renders MOSFETs Q1, Q4 conductive and cuts off MOSFETs Q2, Q3, Q5.

If the input RF signal is in a low frequency band, then control signal generating circuit 102 renders MOSFETs Q1, Q3, Q5 conductive and cuts off MOSFETs Q2, Q4. When the input signal power is increased in the low frequency band, the control voltage for MOSFETs Q1, Q3, Q5 is set to a level lower than if they are fully conductive, thereby attenuating the signal power. Alternatively, the control voltage for one or two MOSFETs is kept at a sufficiently high level and the control voltage for the other MOSFETs is set to a level lower than if they are fully conductive, thereby attenuating the signal power.

According to the present exemplary embodiment, for matching the output circuit, inductor L11 may have three selectable inductance values, and one of the three selectable inductance values may be selected depending on the frequency band of an input RF signal.

Exemplary Embodiment 6

Figure 10:
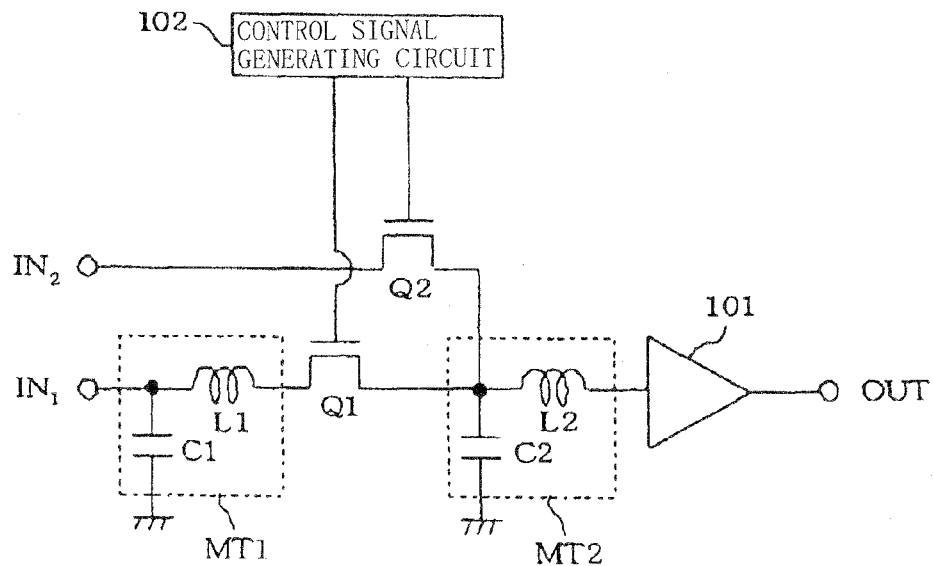
FIG. 10 is a circuit diagram of a sixth exemplary embodiment of the present invention.

FIG. 10 is a circuit diagram of a sixth exemplary embodiment of the present invention. $IN_1$, $IN_2$ represent input terminals to which an RF signal is input, OUT an output terminal, MT1, MT2 matching circuits, C1, C2 capacitors, L1, L2 inductors, Q1, Q2 n-type MOSFETs, 101 an amplifier, and 102 a control signal generating circuit for selecting signal paths.

If an RF signal in a high frequency band is input from input terminal $IN_2$, then control signal generating circuit 102 cuts off MOSFET Q1 and renders MOSFET Q2 conductive. The input RF signal is now amplified by a circuit including matching circuit MT2 and amplifier 101. When the input signal power is increased, the control voltage for MOSFET Q2 is set to a level lower than if it is fully conductive, and the drain-to-source resistance of MOSFET Q2 is increased to attenuate the signal power. In this manner, amplifier 101 is prevented from being saturated to achieve a wide dynamic range.

If an RF signal in a low frequency band is input from input terminal $IN_1$, then control signal generating circuit 102 renders MOSFET Q1 conductive and cuts off MOSFET Q2. The input RF signal is now amplified by a circuit including matching circuits MT1, MT2 and amplifier 101. The amount by which matching circuit MT2 converts the impedance required for matching at a desired frequency is exclusive of the amount by which matching circuit MT1, connected to the front stage of matching circuit MT2, converts the impedance. As a result, the circuit size of matching circuit MT2 may be reduced.

When the input signal power is increased, the control voltage for MOSFET Q1 is set to a level lower than if it is fully conductive, and the drain-to-source resistance of the MOSFET is increased to attenuate the signal power. In this manner, amplifier 101 is prevented from being saturated to achieve a wide dynamic range. Amplifier 101 is required to have an ability to amplify all frequency bands to be handled.

According to the present exemplary embodiment, the resistances of the selector switches inserted in the signal paths are controlled to adjust the intensity of the input signal. Therefore, the amplifying circuit is free of a signal leak path as with the circuit shown in FIG. 1, and maintains good characteristics even when a weak signal is input thereto.

Exemplary Embodiment 7

Figure 11:
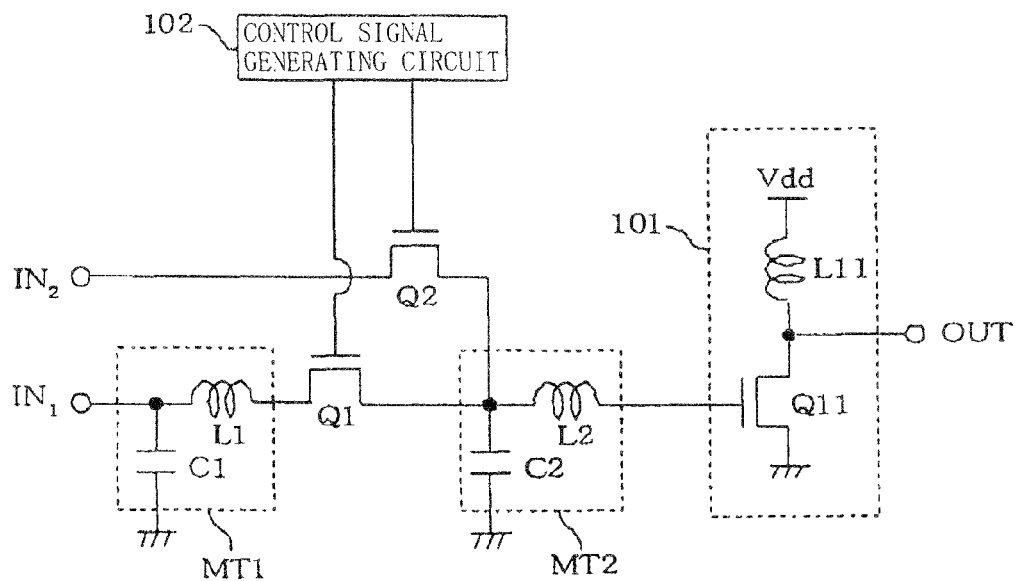
FIG. 11 is a circuit diagram of a seventh exemplary embodiment of the present invention.

FIG. 11 is a circuit diagram of a seventh exemplary embodiment of the present invention. In the present exemplary embodiment, amplifier 101 shown in FIG. 10 comprises n-type MOSFET Q11 and inductor L11. MOSFET Q11 has a source electrode connected to ground, a gate electrode supplied with an RF signal, and a drain electrode connected to output terminal OUT.

Inductor L11 is connected as a load on MOSFET Q11 between power supply terminal Vdd and the drain of MOSFET Q11. The input RF signals are controlled by control signal generating circuit 102 such that only their desired frequency bands are propagated, and the signals are amplified by amplifier 101 and output therefrom.

Exemplary Embodiment 8

Figure 12:
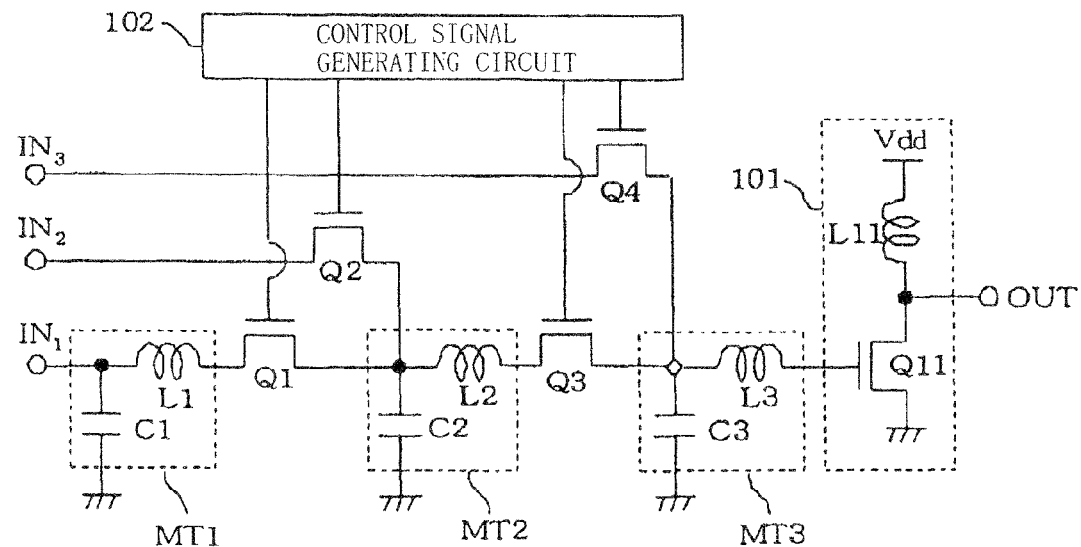
FIG. 12 is a circuit diagram of an eighth exemplary embodiment of the present invention.

FIG. 12 is a circuit diagram of an eighth exemplary embodiment of the present invention. In the present exemplary embodiment, switching n-type MOSFET Q3 and matching circuit MT3 are connected between amplifier 101 and matching circuit MT2 according to the seventh exemplary embodiment shown in FIG. 11. Switching n-type MOSFET Q4 is connected between input terminal $IN_3$ and the input terminal of matching circuit MT3. Amplifier 101 comprises n-type MOSFET Q11 and inductor L11 as a load.

If an input RF signal is in a high frequency band, then control signal generating circuit 102 cuts off MOSFETs Q1 through Q3 and renders MOSFET Q4 conductive. If an input RF signal is in an intermediate frequency band, then control signal generating circuit 102 renders MOSFETs Q2, Q3 conductive and cuts off MOSFETs Q1, Q4.

If an RF signal is in a low frequency band, then control signal generating circuit 102 renders MOSFETs Q1, Q3 conductive and cuts off MOSFETs Q2, Q4. When the input signal power is increased in the low frequency band, the control voltage for MOSFETs Q1, Q3 is set to a level lower than if they were fully conductive, thereby attenuating the signal power. Alternatively, the control voltage for either of the MOSFETs is kept at a sufficiently high level and the control voltage for the other MOSFETs is set to a level lower than if they were fully conductive, thereby attenuating the signal power.

According to the present exemplary embodiment, for matching the output circuit, inductor L11 may have three selectable inductance values, and one of the three selectable inductance values may be selected depending on the frequency band of an input RF signal.

Exemplary Embodiment 9

Figure 13:
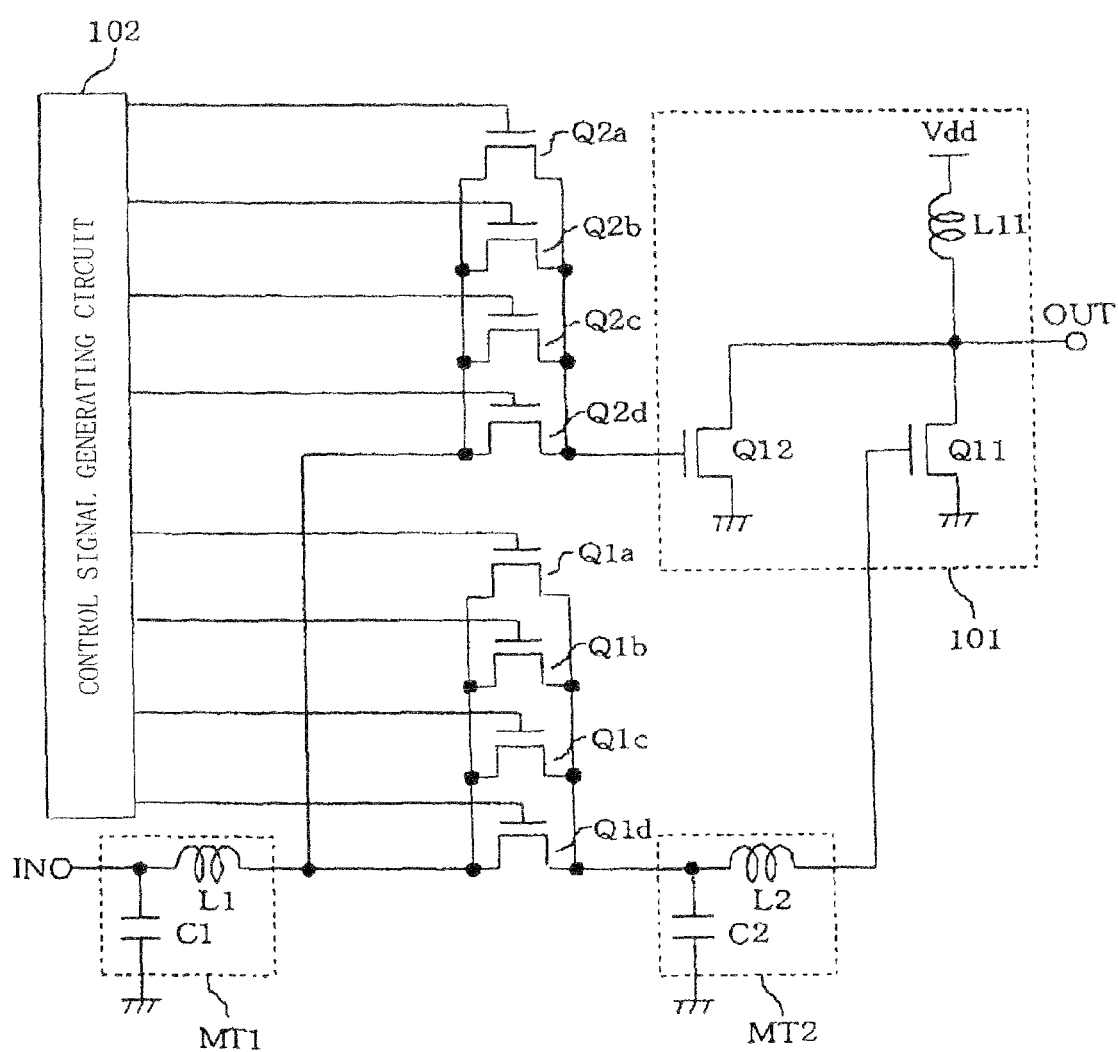
FIG. 13 is a circuit diagram of a ninth exemplary embodiment of the present invention.

FIG. 13 is a circuit diagram of a ninth exemplary embodiment of the present invention. In the present exemplary embodiment, MOSFET Q1 as a selector switch according to the second embodiment is replaced with four parallel-connected MOSFETs Q1a, Q1b, Q1c, Q1d and MOSFET Q2 as a selector switch with four parallel-connected MOSFETs Q2a, Q2b, Q2c, Q2d.

For matching in each of the frequency bands, the amplifying circuit operates in the same manner as with the second embodiment. Therefore, a detailed description about the matching will be omitted, and operation of the circuit according to the present exemplary embodiment at the time the input signal power is increased will be described below. When the input signal power in the high frequency band is increased, control signal generating circuit 102 cuts off all of MOSFETs Q1a, Q1b, Q1c, Q1d.

Control signal generating circuit 102 renders MOSFETs Q2a through Q2d conductive or nonconductive depending on the signal intensity. Specifically, when the signal intensity is the greatest, control signal generating circuit 102 renders only one MOSFET conductive, and cuts off the other three MOSFETs. As the signal amplitude is attenuated by a loss caused by the on-resistance of the switch, amplifier 101 is prevented from being saturated. When the input signal intensity is relatively low, control signal generating circuit 102 renders three MOSFETs conductive, and cuts off the other MOSFET.

Consequently, the attenuated amount can be lower than the attenuated amount described above. If the signal intensity is significantly small, then all the switches are rendered conductive so that the amplifying circuit can have a maximum gain. When the input signal power is large in the low frequency band, the amplifying circuit operates in the same manner except that MOSFETs Q1a, Q1b, Q1c, Q1d and MOSFETs Q2a, Q2b, Q2c, Q2d are switched around.

According to the ninth exemplary embodiment, the control signals for the circuit may be set to conductive, nonconductive, and intermediate levels, rather than only the conductive and nonconductive levels. In such a case, attenuating gains become available in more combinations to enable the amplifier input stage to adjust the entire gain to a nicety.

Exemplary Embodiment 10

Figure 14:
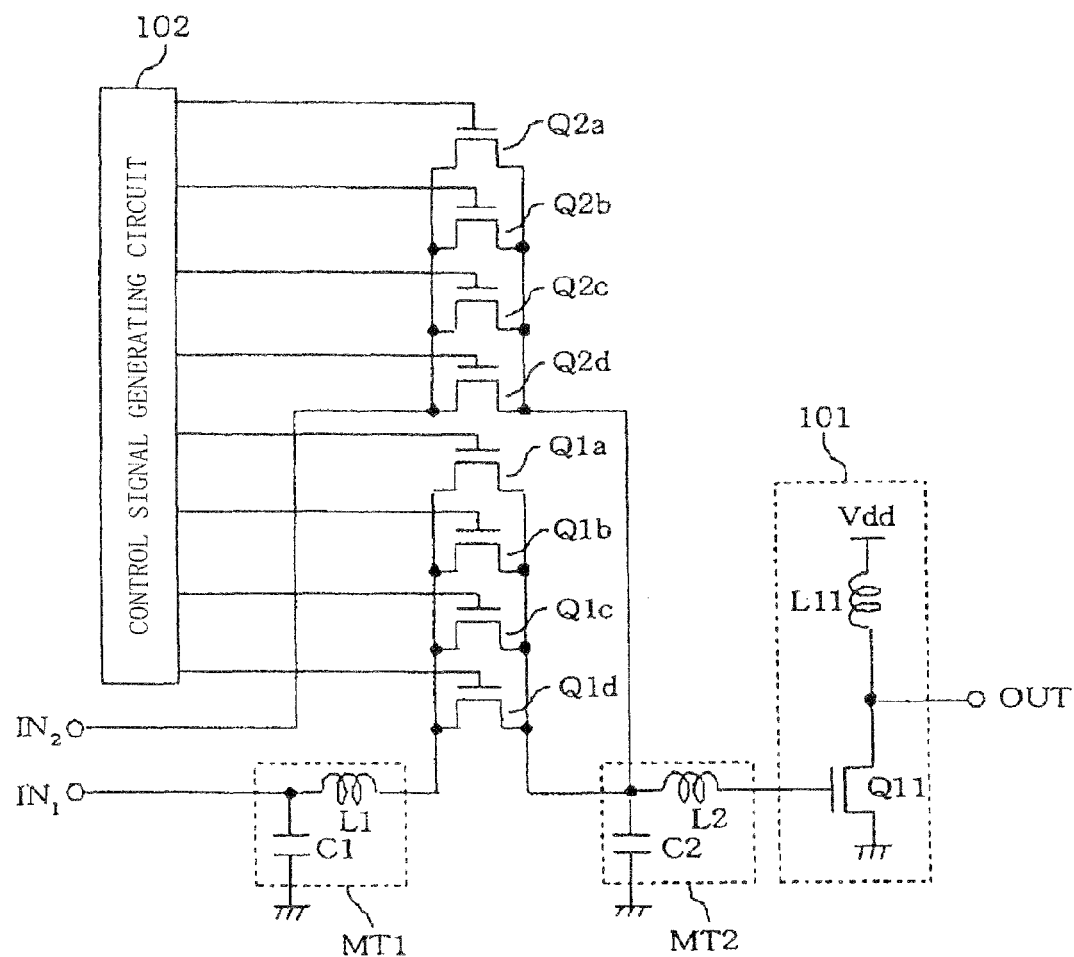
FIG. 14 is a circuit diagram of a tenth exemplary embodiment of the present invention.

FIG. 14 is a circuit diagram of a tenth exemplary embodiment of the present invention. In the present exemplary embodiment, MOSFET Q1 as a selector switch according to the seventh exemplary embodiment is replaced with four parallel-connected MOSFETs Q1a, Q1b, Q1c, Q1d and MOSFET Q2 as a selector switch with four parallel-connected MOSFETs Q2a, Q2b, Q2c, Q2d.

For matching in each of the frequency bands, the amplifying circuit operates in the same manner as with the seventh embodiment. Therefore, a detailed description about the matching will be omitted, and operation of the circuit according to the present exemplary embodiment at the time the input signal power is increased will be described below. When the input signal power in the high frequency band is increased, control signal generating circuit 102 cuts off all of MOSFETs Q1a, Q1b, Q1c, Q1d. Control signal generating circuit 102 renders MOSFETs Q2a through Q2d conductive or nonconductive depending on the signal intensity.

Specifically, when the signal intensity is the greatest, control signal generating circuit 102 renders only one MOSFET conductive, and cuts off the other three MOSFETs. As the signal amplitude is attenuated by a loss caused by the on-resistance of the switch, amplifier 101 is prevented from being saturated. When the input signal intensity is relatively low, control signal generating circuit 102 renders three MOSFETs conductive, and cuts off the other MOSFET.

Consequently, the attenuated amount can be lower than the attenuated amount described above. If the signal intensity is significantly small, then all the switches are rendered conductive so that the amplifying circuit can have a maximum gain. When the input signal power is large in the low frequency band, the amplifying circuit operates in the same manner except that MOSFETs Q1a, Q1b, Q1c, Q1d and MOSFETs Q2a, Q2b, Q2c, Q2d are switched around.

According to the tenth exemplary embodiment, the control signals for the circuit may be set to conductive, nonconductive, and intermediate levels, rather than only to the conductive and nonconductive levels. In such a case, attenuating gains become available in more combinations to enable the amplifier input stage to adjust the entire gain to a nicety.

Figure 15:
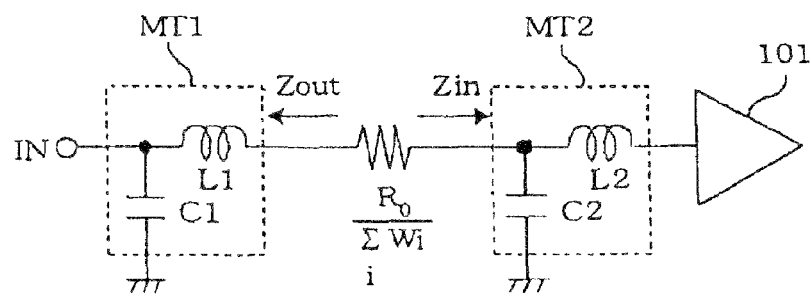
FIG. 15 is a circuit diagram illustrating a signal attenuating effect of a switching device (MOSFET) according to the present invention.

FIG. 15 is a circuit diagram illustrating the attenuated amount of a signal that is achieved by a group of transistors as switch circuits according to the ninth and tenth exemplary embodiments. In FIG. 15, IN represents an input terminal to which an RF signal is input, MT1, MT2 matching circuits, and 101 an amplifier. Zout represents the impedance of the input terminal as seen from the switch circuit, and Zin the input impedance of the amplifier as seen from the switch circuit. $R_0$ represents a resistance as converted into a unit gate width with the switching MOSFETs being rendered conductive.

The loss caused by the switch circuits in the illustrated circuit is given by the following equation:

$$\text{Loss} = 20 \log\left(\frac{Z_{in} + Z_{out}}{\frac{R_0}{\sum_i W} + Z_{in} + Z_{out}}\right) \quad \text{[Equation 1]}$$

$$= 20\left\{\log(Z_{in} + Z_{out}) - \log\left(\frac{R_0}{\sum_i W} Z_{in} + Z_{out}\right)\right\}$$

$$= -20 \log\left(1 + \frac{R_0}{\sum_i W} \frac{1}{Z_{in} + Z_{out}}\right)$$

It can be seen from the above equation that the amount by which a signal is attenuated can be varied by changing the number of transistors that are rendered conductive. Setting the control voltage to an intermediate level is equivalent to increasing resistance $R_0$ as converted into a unit gate width. This can also be used to adjust the amount by which a signal is attenuated.

If only one MOSFET is rendered conductive, then the maximum amount by which a signal is attenuated can be expressed by:

$$\text{Loss}_{max} = -20 \log\left(1 + \frac{R_0}{Z_{in} + Z_{out}}\right) \quad \text{[Equation 2]}$$

If resistance $R_0$ as converted into a unit gate width of MOSFET or resistance $R_0$ per MOSFET is equal to the sum of Zin and Zout, then it can be understood that the maximum adjustable amount by which a signal is attenuated is 6 dB. With the amplifying circuit according to the sixth exemplary embodiment of the present invention, therefore, the amount that can be controlled is 6 dB or greater by making the on-resistance of each of parallel-connected MOSFETs greater than the sum of the impedances of circuits connected to the opposite ends of the MOSFETs in order to increase the input dynamic range.

Exemplary Embodiment 11

Figure 16:
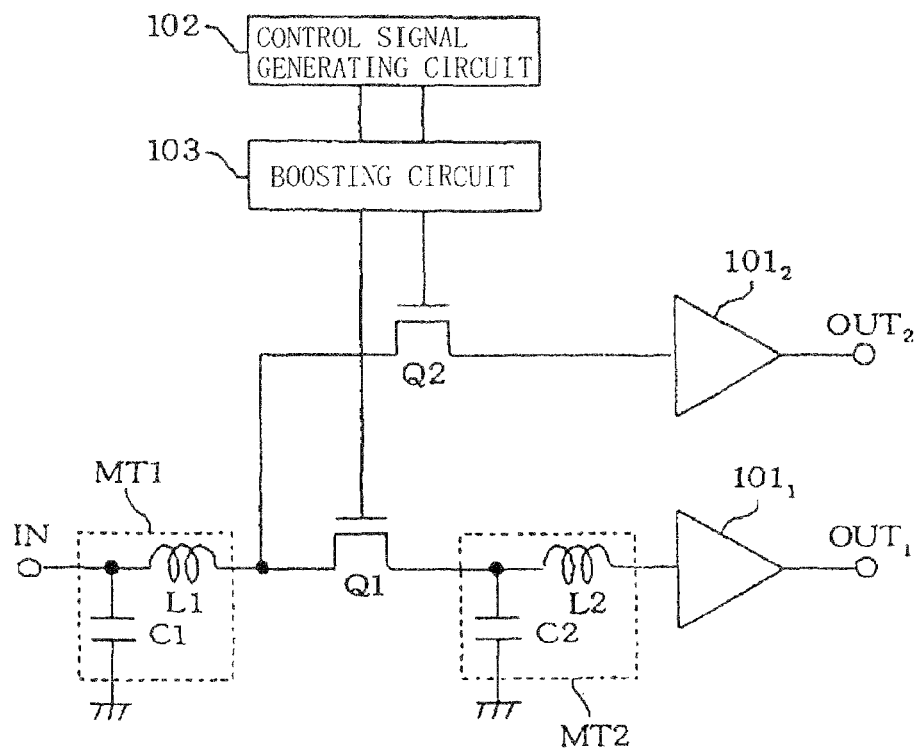
FIG. 16 is a circuit diagram of an eleventh exemplary embodiment of the present invention.

FIG. 16 is a circuit diagram of an eleventh exemplary embodiment of the present invention. In the present exemplary embodiment, a boosting circuit is connected to a control signal in the second exemplary embodiment to raise the potentials of the control signals to reduce the on-resistances of switches. If the power supply voltage is high, then the gate-to-source potential difference of a switching MOSFET cannot be increased even though the control signal is of the same potential as the power supply voltage.

Generally, if the gate width of a MOSFET is increased, then the on-resistance of the MOSFET is reduced. However, since the parasitic capacitance is also increased, the increased gate width not only affects matching conditions, but also increases signal loss. According to the present exemplary embodiment, a control signal generated by control signal generating circuit 102 is increased in voltage by the boosting circuit and then is applied to the gates of MOSFETs Q1, Q2.

Figure 17:
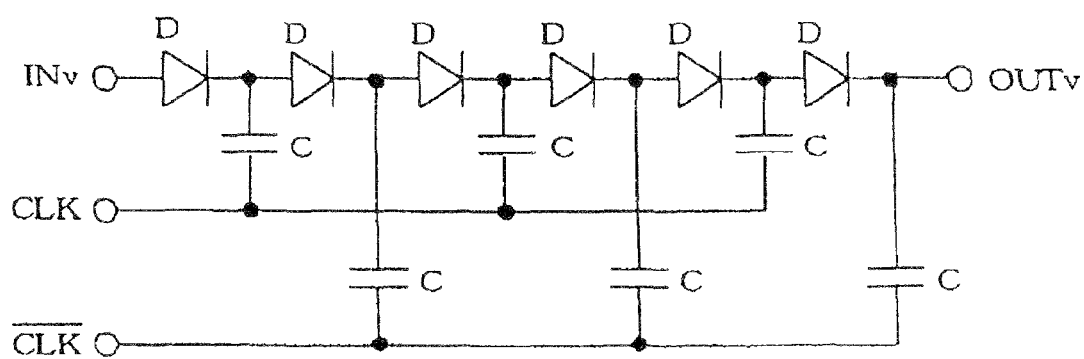
FIG. 17 is a circuit diagram showing an example of a boosting circuit used in the eleventh exemplary embodiment of the present invention.

One example of a boosting circuit which operates in the above manner is illustrated in FIG. 17. The boosting circuit employs a rectifying circuit shown in John F. Dickson, "On-chip high-voltage generation in MNOS integrated circuits using an improved voltage multiplier technique," IEEE Journal of Solid-State Circuits, vol. SC-11, No. 3, pp. 374-378, 1976. In FIG. 17, INv represents a voltage input terminal, OUTv an output terminal, CLK, CLKbar clock input terminals to which complementary clock signals are input, D a diode, and C a capacitor.

Voltage input terminal INv of the circuit is connected to the output terminal of control signal generating circuit 102, and output terminal OUTv is connected to the gates of MOSFETs Q1, Q2. The boosting circuit is capable of developing a voltage increase per diode which is of a value produced by subtracting a forward voltage across the voltage and a ripple voltage caused when the capacitor is charged and discharged by an output current from the amplitude of a clock signal at a diode-to-diode node. The boosting circuit which is inserted between control signal generating circuit 102 and the MOSFETs serving as matching circuit selector switches is capable of increasing the potential difference between the cut-off state and the conducted state. It is thus possible to reduce the on-resistance even if large size MOSFETs are not employed.

In exemplary embodiment 11, the output voltage of control signal generating circuit 102 is increased. However, a boosted voltage may be applied to energize control signal generating circuit 102 thereby increasing the voltage difference between the control signals that are output from control signal generating circuit 102.

Exemplary Embodiment 12

Figure 18:
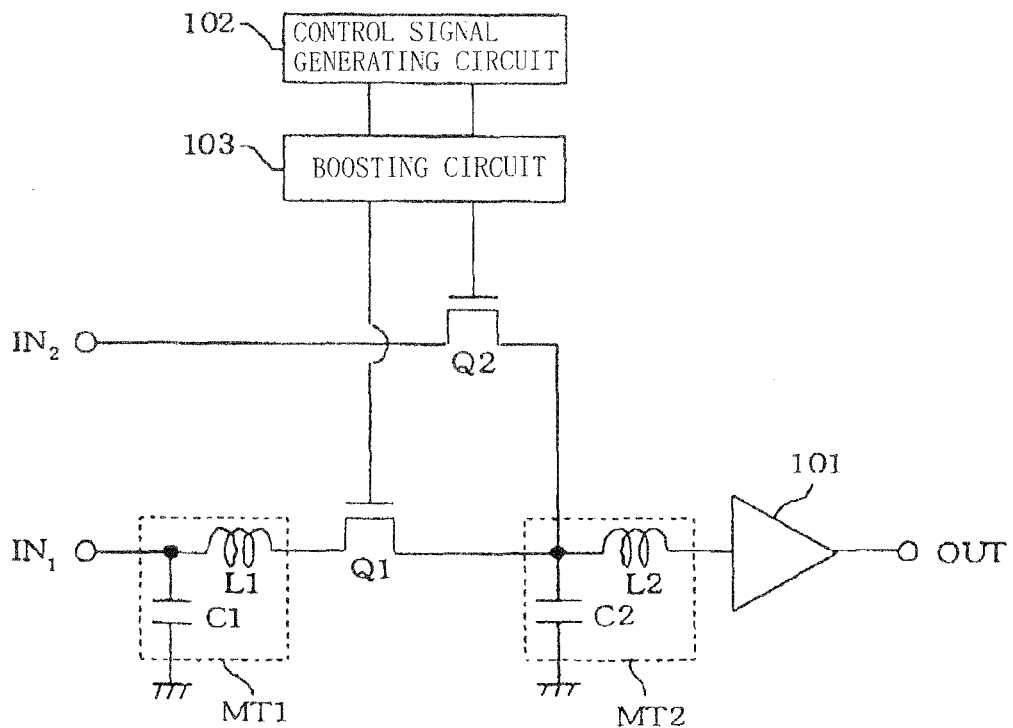
FIG. 18 is a circuit diagram of a twelfth exemplary embodiment of the present invention.

FIG. 18 is a circuit diagram of a twelfth exemplary embodiment of the present invention. In the present exemplary embodiment, a boosting circuit is connected to a control signal in the sixth exemplary embodiment to raise the potentials of the control signals to reduce the on-resistances of switches. If the power supply voltage is high, then the gate-to-source potential difference of a switching MOSFET cannot be increased even though the control signal is of the same potential as the power supply voltage.

Generally, if the gate width of a MOSFET is increased, then the on-resistance of the MOSFET is reduced. However, since the parasitic capacitance is also increased, the increased gate width not only affects matching conditions, but also increases signal loss. According to the present exemplary embodiment, a control signal generated by control signal generating circuit 102 is increased in voltage by the boosting circuit and then is applied to the gates of MOSFETs Q1, Q2.

Exemplary Embodiment 13

Figure 19:
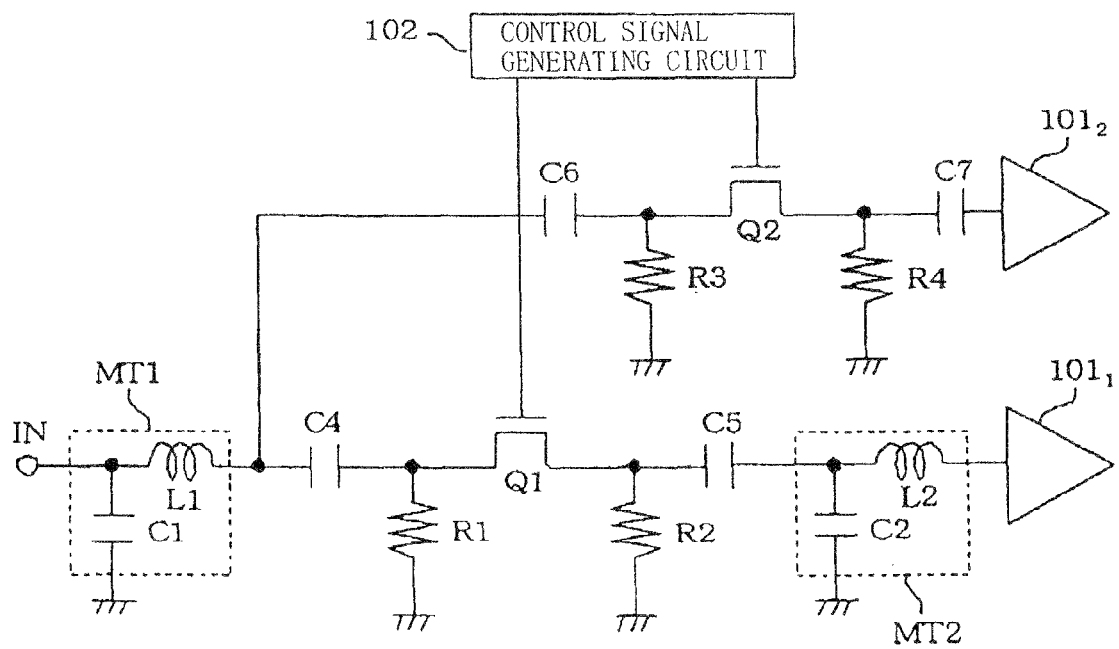
FIG. 19 is a circuit diagram of a thirteenth exemplary embodiment of the present invention.

FIG. 19 is a circuit diagram of a thirteenth exemplary embodiment of the present invention. In the present exemplary embodiment, capacitors are connected to the drain and source electrodes of MOSFETs that serve as selector switches to which control signals are input in the second exemplary embodiment, for cutting off DC potentials of the matching circuits and for applying new lower DC potentials thereto. In FIG. 19, C4 through C7 represent capacitors, and R1 through R4 represent resistors having high resistance values.

Switching MOSFETs Q1, Q2 are DC-isolated from matching circuits MT1, MT2 and have their source and drain electrodes held at the ground potential by resistors R1 through R4. Since the potential differences between the high-potential signals output from control signal generating circuit 102 and the potentials at the source electrodes of the switching MOSFETs are increased, the on-resistances of the switches are reduced, and, as a result, the switching MOSFETs are reduced in size.

Exemplary Embodiment 14

Figure 20:
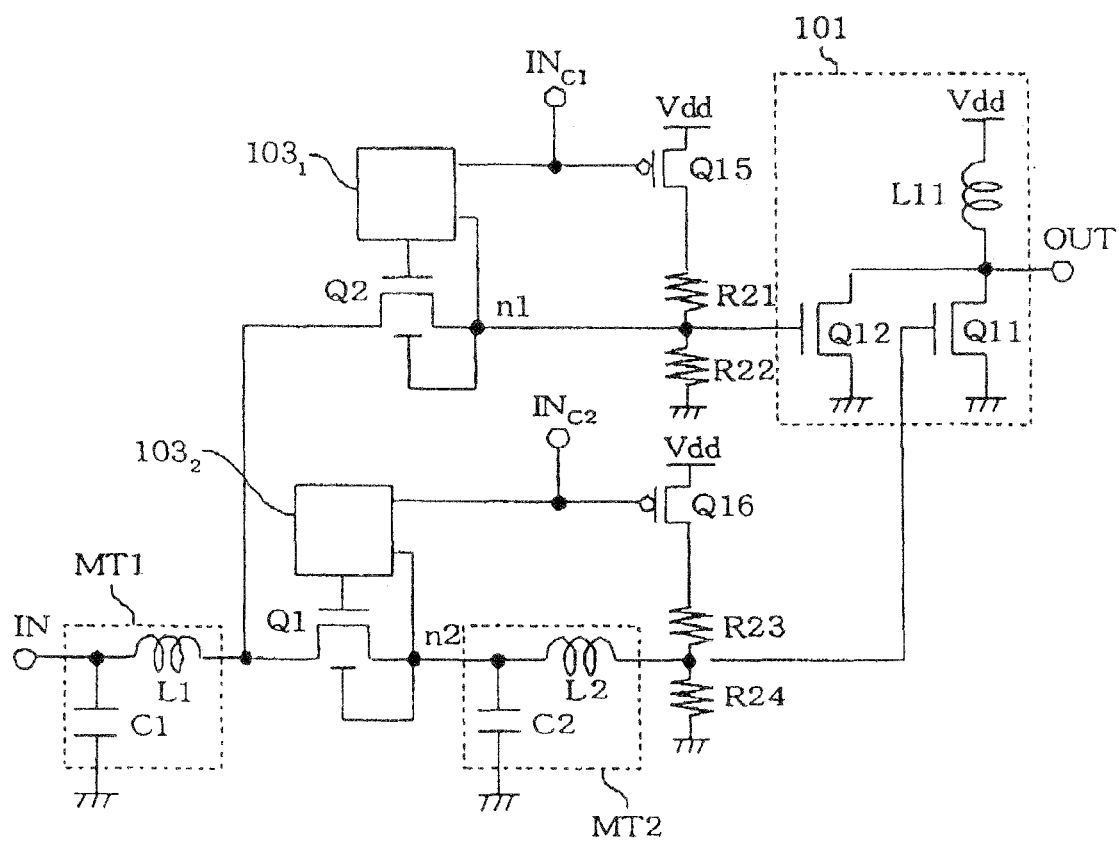
FIG. 20 is a circuit diagram of a fourteenth exemplary embodiment of the present invention.

FIG. 20 is a circuit diagram of a fourteenth exemplary embodiment of the present invention. In the present exemplary embodiment, the substrate potentials of MOSFETs Q1, Q2 used as the selector switches in the eleventh exemplary embodiment are linked to the DC input potential of the amplifier, and the control potentials for the selector switches are increased by the DC input potential of the amplifier, for thereby minimizing the on-resistances of the selector switches that are rendered conductive.

Specifically, the gate potentials of MOSFETs Q1, Q2 are controlled as described above by the outputs of boosting circuits $103_1$, $103_2$ to which there are input control signals $IN_{C1}$, $IN_{C2}$ and the potentials of nodes n1, n2 where the DC input potential of amplifier 101 appear. Details of boosting circuits $103_1$, $103_2$ will be described later. In the present exemplary embodiment, amplifiers $101_1$, $101_2$ according to the eleventh embodiment shown in FIG. 16 are replaced with single amplifier 101.

Amplifier 101 comprises inductor L11 and n-type MOSFETs Q11, Q12. MOSFET Q12 has a source electrode connected to ground, a gate electrode supplied with an RF signal in a high frequency band, and a drain electrode connected to output terminal OUT, MOSFET Q11 has a source electrode grounded, a gate electrode supplied with an RF signal in a low frequency band, and a drain electrode connected to output terminal OUT.

Inductor L11 is connected as a load on MOSFETs Q11, Q12 between power supply terminal Vdd and the drains of the respective transistors. The input RF signal is controlled by control signals $IN_{C1}$, $IN_{C2}$ such that only its desired frequency band is propagated. Q15, Q16 represent p-type MOSFETs and R21 through R24 represent resistors. When control signal $IN_{C1}$ is of a low potential, MOSFET Q15 is rendered conductive, and the input potential of MOSFET Q12 of the amplifier is set to a value produced when the power supply potential is divided by resistors R21, R22.

At this time, control signal $IN_{C1}$ is set to a high potential, cutting off MOSFET Q16 to hold the input potential of MOSFET Q11 of the amplifier at the ground potential. Therefore, only the MOSFET of the amplifier which is connected to the path in a desired frequency band is activated, thereby amplifying only the signal in the desired frequency band.

At this time, boosting circuit $103_2$ outputs the ground potential, cutting off MOSFET Q1. The substrate of selector switch (Q1) is connected to node n2 where the DC input potential of MOSFET Q11 of the amplifier appears. As described above, when control signal $IN_{C2}$ is of a low potential, the substrate is held at the ground potential. Boosting circuit $103_1$ generates a potential that is higher than the power supply potential by the amount of the DC input potential of MOSFET Q12 of the amplifier, rendering MOSFET Q2 conductive.

Since the gate-to-source voltage of selector switch (Q2) is set to Vdd, the on-resistance of the switch is sufficiently reduced. Inasmuch as the substrate potential of selector switch (Q2) is given by node n1 where the DC input potential of MOSFET Q12 appears, any voltages in excess of Vdd are not applied between the electrodes of the selector switch.

Figure 21:
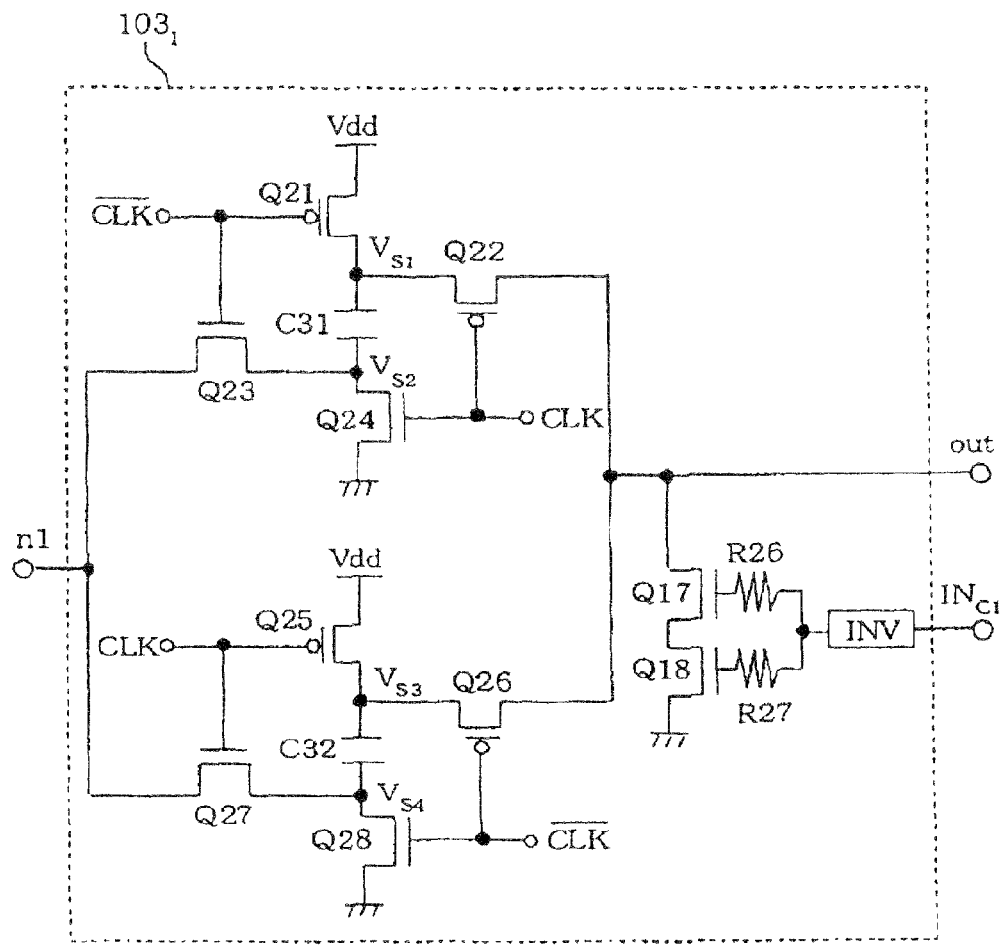
FIG. 21 is a circuit diagram showing an example of a boosting circuit used in the fourteenth exemplary embodiment of the present invention.

FIG. 21 is a circuit diagram showing an example of boosting circuit $103_1$ used in the fourteenth exemplary embodiment. Since boosting circuit $103_2$ is constructed and operates in the same manner as with boosting circuit $103_1$, only boosting circuit $103_1$ will be described below. Q21, Q22, Q25, Q25 represent p-type MOSFETs, Q17, Q18, Q23, Q24, Q27, Q28 represent n-type MOSFETs, C31, C32 capacitive elements, R26, R27 resistors, and INV an inverter. Control signal $IN_{C1}$ is input through resistors R26, R27 to the gates of MOSFETs Q17, Q18. Node n1 is connected to the sources of MOSFETs Q23, Q27.

The boosting circuit supplies an output voltage through output terminal to the gate of MOSFET Q2 serving as a selector switch. In the present example, clock signal CLK is applied to MOSFETs Q22, Q24, Q25, Q27, and signal CLK-bar, which is in reverse phase to clock signal CLK, is applied to MOSFETs Q21, Q23, Q26, Q28.

Operation of a unit circuit that is made up of MOSFETs Q21 through Q24 and capacitor C31 will first be described below. When clock signal CLK is of a high potential, since capacitive element C31 is connected between power supply Vdd and a ground, capacitive element C31 is charged with an electric charge corresponding to voltage Vdd in the present cyclic period.

When clock signal CLK goes low in potential, capacitive element C31 is disconnected from the power supply and the ground electrode, and is connected to output terminal OUT and node n1 that is held at the DC input potential of the amplifier, by MOSFETs Q23, Q22 that are controlled by reverse-phase clock signal CLKbar that is of a high potential. At this time, since the charged stored in capacitive element C31 is not instantaneously discharged, the potential of the capacitive electrode that is connected to output terminal OUT is increased from the power supply voltage by the DC input potential of the amplifier.

In a next cyclic period, the output terminal is disconnected from capacitive element C31, which is connected between the power supply and the ground. The unit circuit then repeats the above operation. A unit circuit that is mad up of MOSFETs Q25 through Q28 and capacitive element C32 operates according to a clock signal that is in reverse phase to the clock signal applied to the above unit circuit, and hence outputs a signal that is in reverse phase to the signal output from the above unit circuit. As a result, output terminal OUT outputs a potential that is higher than power supply voltage Vdd by the amount of the DC input potential of the amplifier at all times.

At this time, since control signal $IN_{C1}$ is of a high potential, MOSFETs Q17, Q18 are turned off, outputting the above output voltage as it is. When MOSFET Q2 shown in FIG. 20 is cut off, control signal $IN_{C1}$ goes low in potential, and the output potential is forcibly set to the ground potential by a circuit that is made up of inverter INV, resistors R26, R27, and MOSFETs Q17, Q18. MOSFETs Q17, Q18 are cascaded in taking into amount of the withstand voltage of the circuit because the circuit outputs a potential higher than power supply voltage Vdd.

In another way of grounding the output terminal of the boosting circuit according to the present exemplary embodiment, the output terminal may be disconnected from the boosting circuit by stopping the control clock signal. This alternative is effective to lower the capability for driving the circuit of MOSFETs Q17, Q18 for reduced power consumption.

Figure 22:
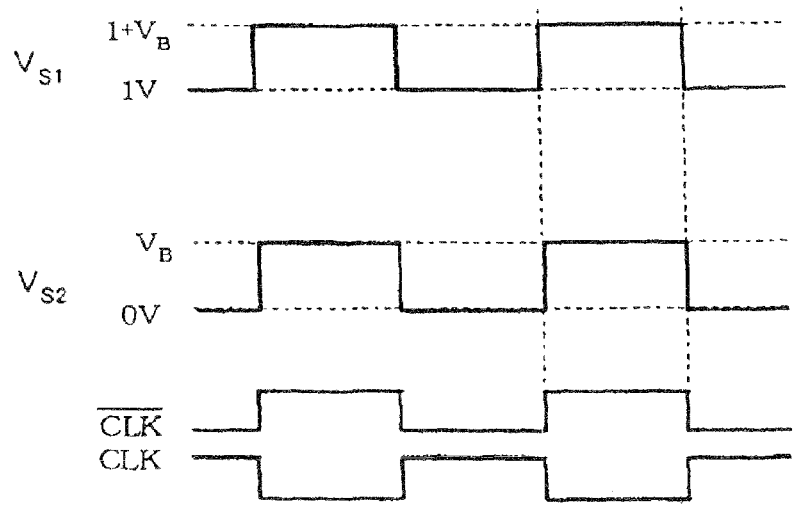
FIG. 22 is a diagram showing operating waveforms of the boosting circuit used in the fourteenth exemplary embodiment of the present invention.

FIG. 22 is a diagram showing operating waveforms of the above boosting circuit. $V_{S1}$, $V_{S2}$ represent respective terminal potentials of capacitive element C31 on the respective sides of MOSFETs Q21, Q24. The clock signal has an amplitude set to 1 V of power supply voltage Vdd, and the potential at node n1 is set to $V_B$. Capacitive terminal potentials $V_{S1}$, $V_{S2}$ vary as shown depending on the clock signal. Respective terminal potentials $V_{S3}$, $V_{S4}$ of capacitive element C32 on the respective sides of MOSFETs Q25, Q28 are in reverse phase to terminal potentials $V_{S1}$, $V_{S2}$, respectively.

Therefore, boosted potentials $(1+V_B)$ from terminal potentials $V_{S1}$, $V_{S3}$ alternately appear at output terminal OUT, and hence a potential which is higher than power supply potential Vdd by the amount of DC input potential $V_B$ of the amplifier appears at output terminal OUT at all times.

Exemplary Embodiment 15

Figure 23:
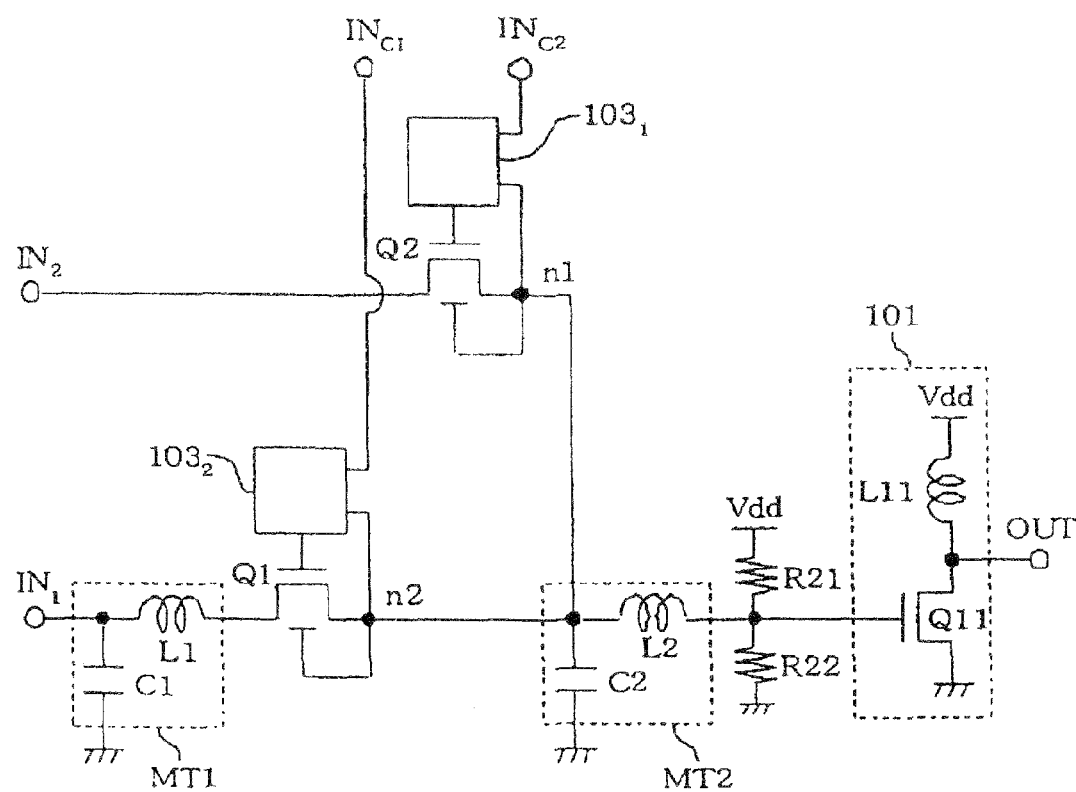
FIG. 23 is a circuit diagram of a fifteenth exemplary embodiment of the present invention.

FIG. 23 is a circuit diagram of a fifteenth exemplary embodiment of the present invention. In the present exemplary embodiment, the substrate potentials of MOSFETs Q1, Q2 used as the selector switches in the twelfth exemplary embodiment are linked to the DC input potential of the amplifier, and the control potentials for the selector switches are increased by the DC input potential of the amplifier, to thereby minimize the on-resistances of the selector switches that are rendered conductive.

Specifically, the gate potentials of MOSFETs Q1, Q2 are controlled as described above by the outputs of boosting circuits $103_1$, $103_2$ to which there are input control signals $IN_{C1}$, $IN_{C2}$ and the potentials of nodes n1, n2 where the DC input potential of amplifier 101 is present. Details of boosting circuits $103_1$, $103_2$ have been described with reference to FIGS. 21, 19 and will not be described below.

Amplifier 101 comprises inductor L11 and n-type MOS-FET Q11. MOSFET Q11 has a source electrode grounded, a gate electrode supplied with an RF signal in a high frequency band, and a drain electrode connected to output terminal OUT. Inductor L11 is connected as a load on MOSFET Q11 between power supply terminal Vdd and the drain of MOS-FET Q11. The input RF signal is controlled by control signals $IN_{C1}$, $IN_{C2}$ such that only its desired frequency band is propagated. R21, R22 represent resistors for dividing the power supply voltage.

When control signal $IN_{C1}$ is of a low potential, boosting circuit $103_2$ outputs the ground potential, cutting off MOSFET Q1. Boosting circuit $103_1$ generates a potential that is higher than the power supply potential by the amount of DC input potential of MOSFET Q12 of the amplifier, rendering MOSFET Q2 conductive. Since the gate-to-source voltage of selector switch (Q2) is set to Vdd, the on-resistance of the switch is sufficiently reduced. Inasmuch as the substrate potential of selector switch (Q2) is given by node n1 where the DC input potential of MOSFET Q12 is present, any voltages in excess of Vdd are not applied between the electrodes of the selector switch.

While the preferred exemplary embodiments of the present invention have been described above, the present invention is not limited to the above embodiments, but changes and modifications may be made therein without departing from the scope of the invention. For example, in the exemplary embodiment shown in FIG. 7, a circuit having two signal paths is shown as being provided in two sets, but may be provided in three or more sets. In the exemplary embodiment shown in FIGS. 8, 9, and 12, three matching circuits are shown as being connected in cascade, but four or more matching circuits may be connected in cascade to provide more branched signal paths. The above exemplary embodiments may be appropriately combined with each other.

In the exemplary embodiments, MOS field-effect transistors have been described. However, the present invention is also applicable to devices having similar characteristics, e.g., junction or MES field-effect transistors, or bipolar transistors. Switching transistors and amplifying transistors may comprise transistors of different types.

The invention claimed is:

1. An amplifying circuit comprising:
a plurality of impedance converting circuits connected to each other by a switching circuit of a first type having a signal cutting-off function; a switching circuit of a second type connected to a path branched from an input side of said switching circuit of the first type, said switching circuit of the second type having a signal cutting-off function; amplifiers connected respectively to an output side of one of said impedance converting circuits in a final stage and to an output side of said switching circuit of the second type; and a control signal generating circuit for controlling connection/disconnection between said switching circuit of the first type and said switching circuit of the second type; wherein either one of the paths is selected to input a signal to one of said amplifiers.

2. An amplifying circuit comprising:
a plurality of impedance converting circuits connected to each other along a path by a switching circuit of a first type having a signal cutting-off function; a switching circuit of a second type connected between an output side of said switching circuit of the first type and an input terminal which is different from an input terminal to which an input side of one of said impedance converting circuits in a first stage is connected, said switching circuit of the second type having a signal cutting-off function; an amplifier connected to an output side of one of said impedance converting circuits in a final stage; and a control signal generating circuit for controlling connection/disconnection between said switching circuit of the first type and said switching circuit of the second type; wherein either one of the paths is selected to input a signal to one of said amplifiers.

3. The amplifying circuit according to claim 1, wherein one or more switching circuits from among said switching circuit of the first type and said switching circuit of the second type has a signal attenuating function.

4. The amplifying circuit according to claim 3, wherein the switching circuit having the signal cutting-off function and the signal attenuating function comprises a plurality of parallel-connected devices each controllable by said control signal generating circuit.

5. The amplifying circuit according to claim 3, wherein the switching circuit having the signal cutting-off function and the signal attenuating function comprises a plurality of parallel-connected devices which can each be cut off or rendered conductive, and the amount by which a signal is attenuated can be controlled by the number of devices which are rendered conductive.

6. The amplifying circuit according to claim 4, wherein said devices have different sizes for attenuating signals by different amounts, respectively.

7. The amplifying circuit according to claim 3, wherein the switching circuit having the signal cutting-off function and the signal attenuating function comprises one or more devices each controllable by said control signal generating circuit to be nonconductive, well conductive, or intermediately conductive.

8. The amplifying circuit according to claim 3, wherein the switching circuit having the signal cutting-off function and the signal attenuating function comprises a voltage-controlled three-terminal device having a control electrode, and a control signal output from said control signal generating circuit is increased in voltage by a boosting circuit and then supplied to the control electrode of said three-terminal device.

9. The amplifying circuit according to claim 8, wherein said boosting circuit increases the voltage of the control signal by an amount equal to or smaller than a DC input voltage of said amplifier.

10. The amplifying circuit according to claim 3, wherein the switching circuit having the signal cutting-off function and the signal attenuating function comprises a voltage-controlled three-terminal control device, further comprising capacitive elements connected respectively to input and output sides of the three-terminal control device along a signal path, wherein junctions between said capacitive elements and said three-terminal control device are connected to a ground through resistive elements.

11. The amplifying circuit according to claim 4, wherein when each of said devices is rendered conductive, its impedance is greater than the sum of impedances as seen from the switching circuit toward the input and output sides.

12. The amplifying circuit according to claim 1, wherein the switching circuits comprise field-effect transistors.

13. The amplifying circuit according to claim 12, wherein the switching circuits which comprise field-effect transistors have a substrate potential linked to a DC input voltage of the amplifier.

14. The amplifying circuit according to claim 8, wherein said boosting circuit comprises two unit circuits each including a capacitive element and two selector switches connected to each of the electrodes of said capacitive element; the selector switches connected to each of the electrodes of said capacitive element are connected to alternately switch between a path along which said capacitive element is connected between a power supply and a ground and a path along which said capacitive element is connected between an output terminal of the boosting circuit and a DC input potential applying point of the amplifier; and said two unit circuits are operable complementarily to each other by complementary signals supplied from an external source.

15. The amplifying circuit according to claim 1, wherein the switching circuits comprise bipolar transistors.

16. The amplifying circuit according to claim 1, including a plurality of sets of a signal path having the impedance converting circuits and the switching circuit of the first type and a signal path extending through the switching circuit of the second type.

17. The amplifying circuit according to claim 1, wherein an output terminal of the amplifier connected to the output side of one of the impedance converting circuits in the final stage and an output terminal of the amplifier connected to an output side of the switching circuit of the second type are connected in common.

18. The amplifying circuit according to claim 17, wherein the amplifier connected to the output side of one of the impedance converting circuits in the final stage and the amplifier connected to the output side of the switching circuit of the second type have different amplifying devices, and the amplifying devices have load impedances provided by a common device.

19. The amplifying circuit according to claim 1, wherein the amplifier connected to the output side of one of the impedance converting circuits in the final stage and the amplifier connected to an output side of the switching circuit of the second type comprise a common amplifying device and a common load impedance, further comprising a switching circuit having a signal cutting-off function which is interposed between one of the impedance converting circuits in the final stage and the amplifier.

20. The amplifying circuit according to claim 2, wherein the amplifier connected to the output side of one of the impedance converting circuits in the final stage comprises an amplifying device and a load impedance.

21. The amplifying circuit according to claim 18, wherein said load impedance comprises an inductor.

22. An amplifying circuit according to claim 18, wherein said load impedance comprises a series-connected assembly of impedance devices, at least one of said impedance devices can be short-circuited by a short-circuiting means, and said load impedance has a variable impedance value.

* * * * *